(12) United States Patent
Okumura

(10) Patent No.: US 6,333,535 B2
(45) Date of Patent: Dec. 25, 2001

(54) SEMICONDUCTOR DEVICE

(75) Inventor: Yoshinori Okumura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/221,127

(22) Filed: Dec. 28, 1998

(30) Foreign Application Priority Data

Aug. 6, 1998 (JP) .................................................. 10-222963

(51) Int. Cl.$^7$ .................................................. H01L 29/80
(52) U.S. Cl. .................................................. 257/306
(58) Field of Search ............................................ 257/306

(56) References Cited

U.S. PATENT DOCUMENTS

| | | | | |
|---|---|---|---|---|
| 5,089,869 | * | 2/1992 | Matsuo et al. | 357/23.6 |
| 5,103,285 | * | 4/1992 | Furumura et al. | 357/68 |
| 5,323,343 | * | 6/1994 | Ogoh et al. | 365/149 |
| 5,392,189 | * | 2/1995 | Fazan et al. | 361/305 |
| 5,406,102 | * | 4/1995 | Oashi | 257/296 |
| 5,444,020 | * | 8/1995 | Lee et al. | 437/195 |
| 5,519,237 | * | 5/1996 | Itoh et al. | 257/306 |
| 5,624,863 | | 4/1997 | Helm et al. | 438/210 |
| 5,700,706 | | 12/1997 | Juengling | 438/253 |

OTHER PUBLICATIONS

W. Wakamiya, et al., Novel Stacked Capacitor Cell For 64Mb DRAM, vol. 89, pp. 69–70.

K. Iguchi, et al., "A Novel DRAM Memory Cell With Inclined–Channel Transistor and Ring–Like Structure Produced Through Self–Aligned Storage Contact Process", vol. 91, pp. 11–12.

K. Suguro, et al., "High Aspect Ration Hole Filling With CVD Tungsten for Multi–Level Interconnection", Extended Abstracts of the 18$^{th}$ Conference on Solid State Devices and Materials, Tokyo 1986, pp. 503–506.

* cited by examiner

Primary Examiner—Stephen D. Meier
Assistant Examiner—C Johnson
(74) Attorney, Agent, or Firm—Oblon, Spivak, McClelland, Maier & Neustadt, P.C.

(57) ABSTRACT

A semiconductor device and manufacturing method are provided in which an increase in contact resistance between a plug and a semiconductor layer and an increase in junction leakage current in a semiconductor layer to which a plug is connected can be prevented and fabrication cost and device area can be reduced. A multi-layer film comprising a metal layer (45), a barrier metal layer (44), a polysilicon layer (43), and a barrier metal layer (42) is patterned by photolithography and etching to form poly-metal bit lines (160) electrically connected to buried layers (43A, 43B) and polysilicon plugs (29).

4 Claims, 42 Drawing Sheets

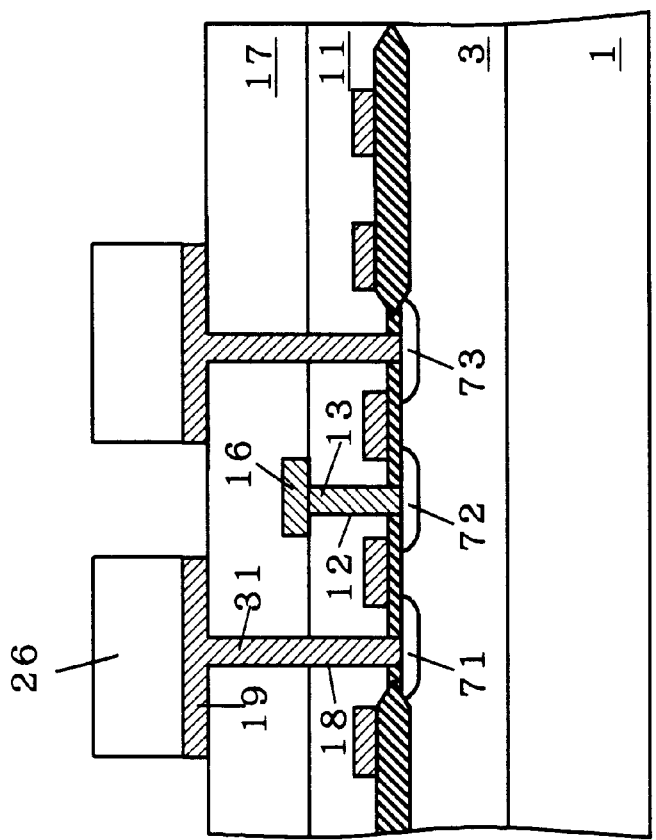
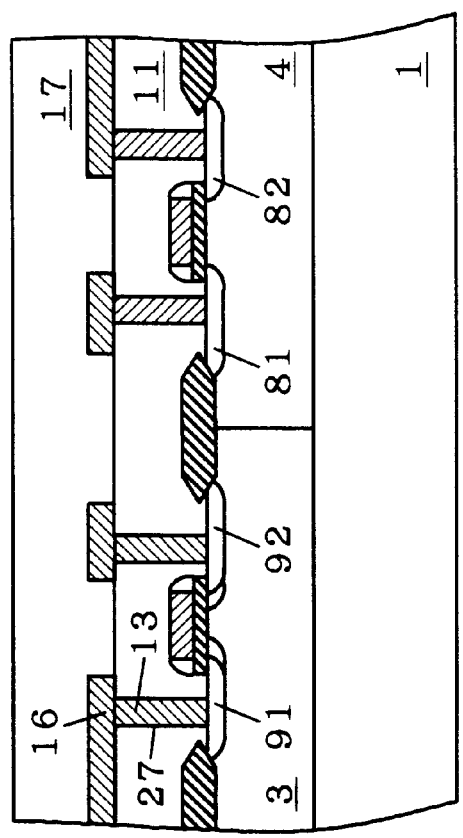
FIG. 7A
FIG. 7B

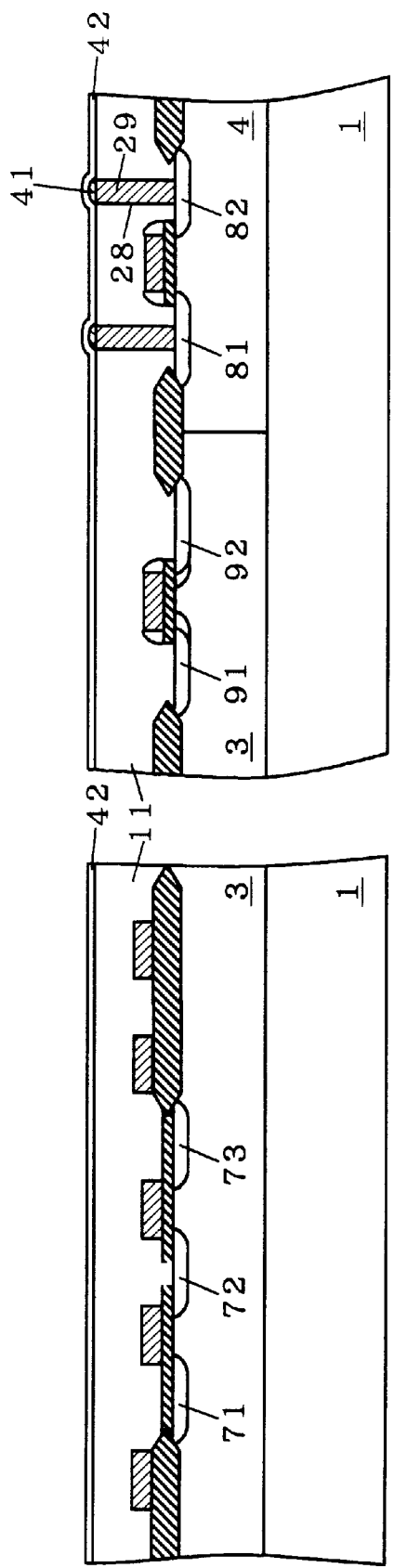

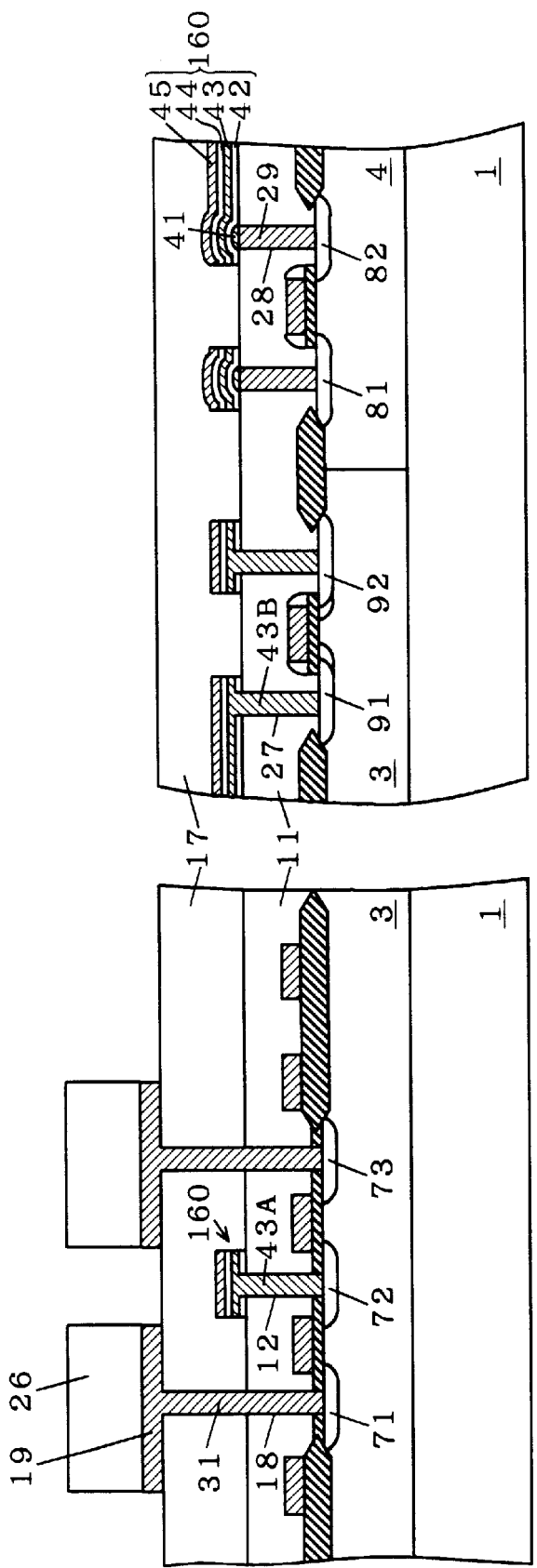

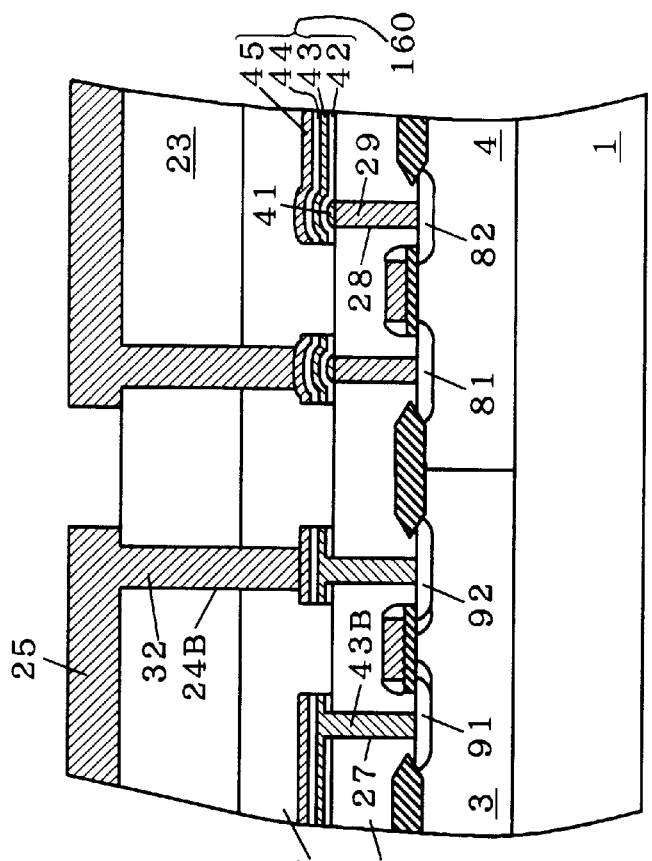
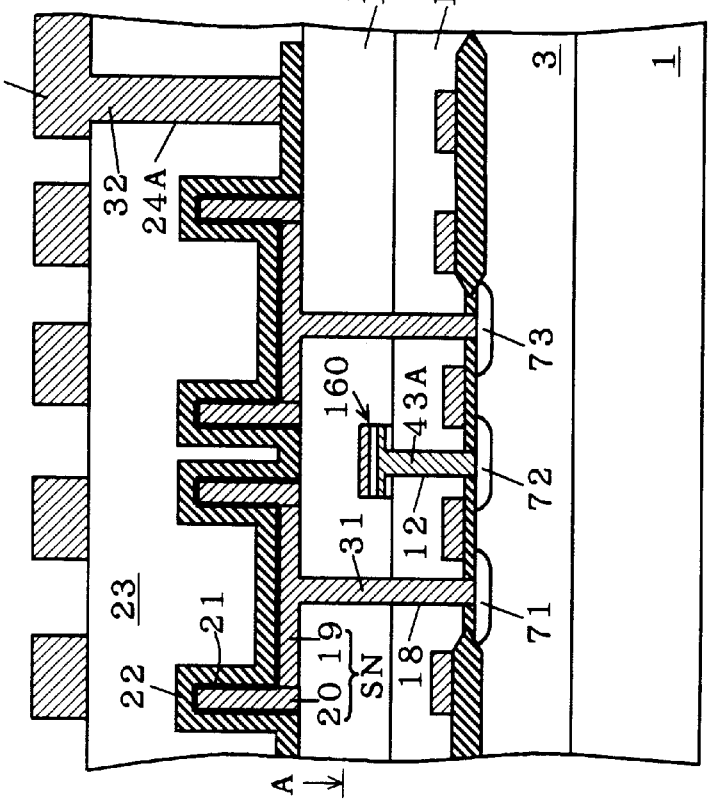

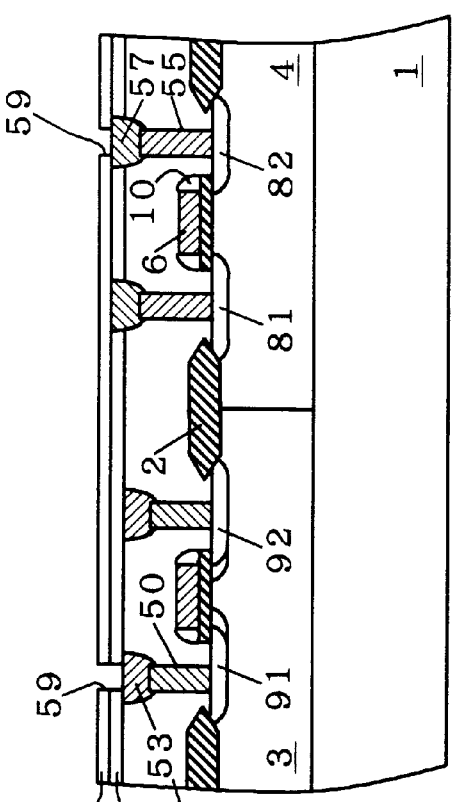
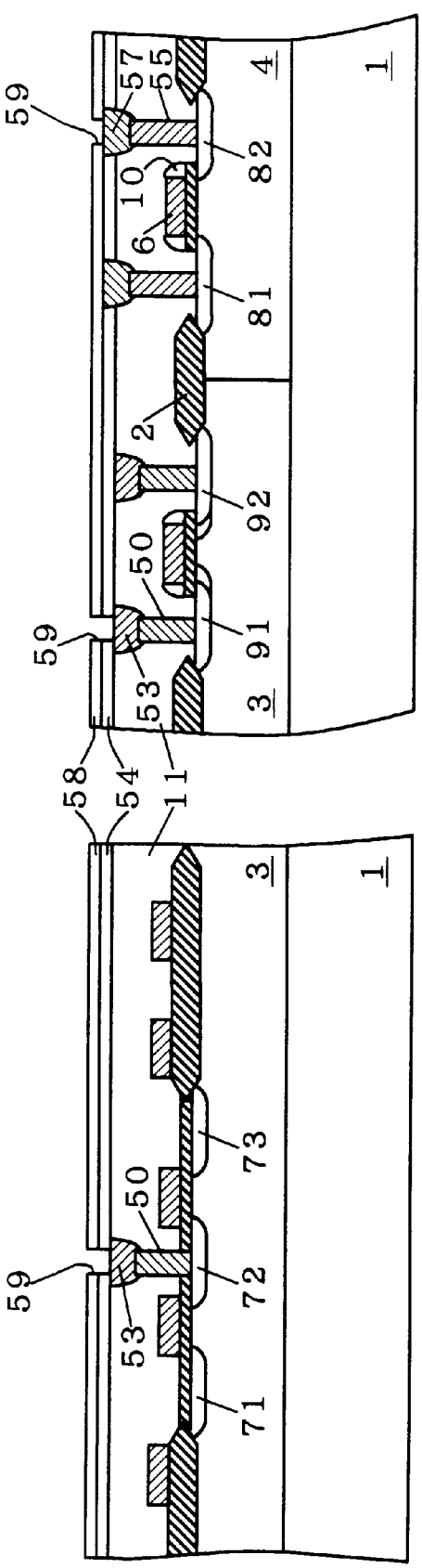

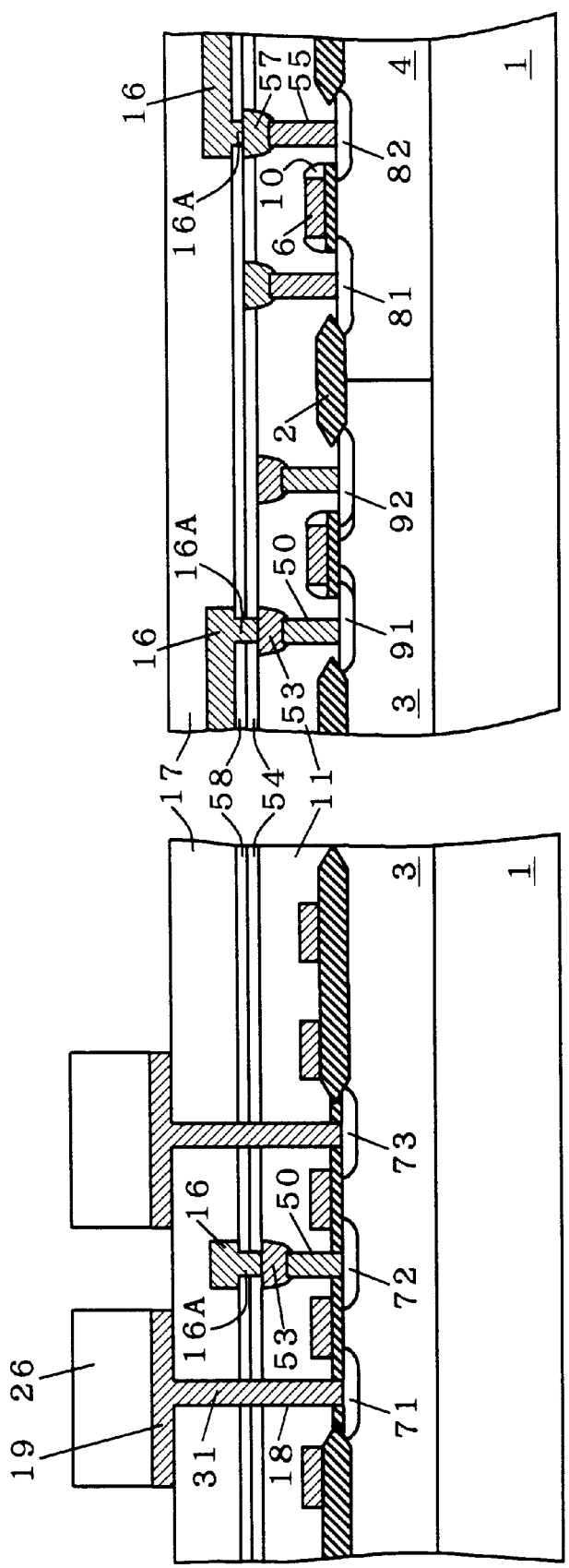

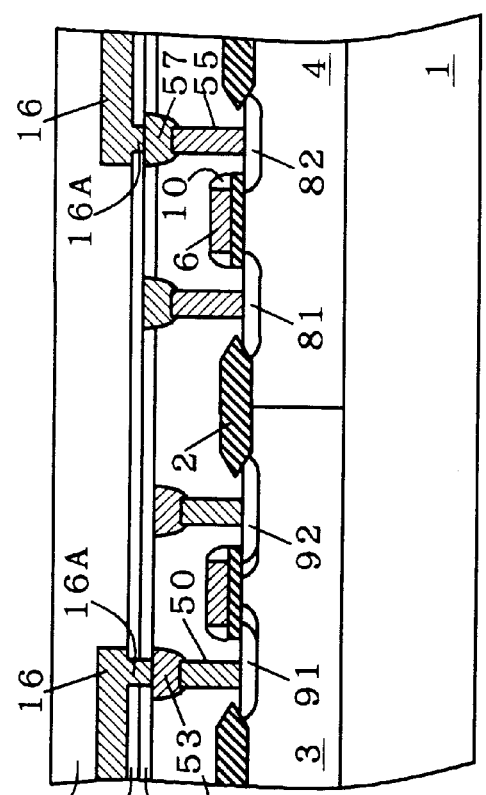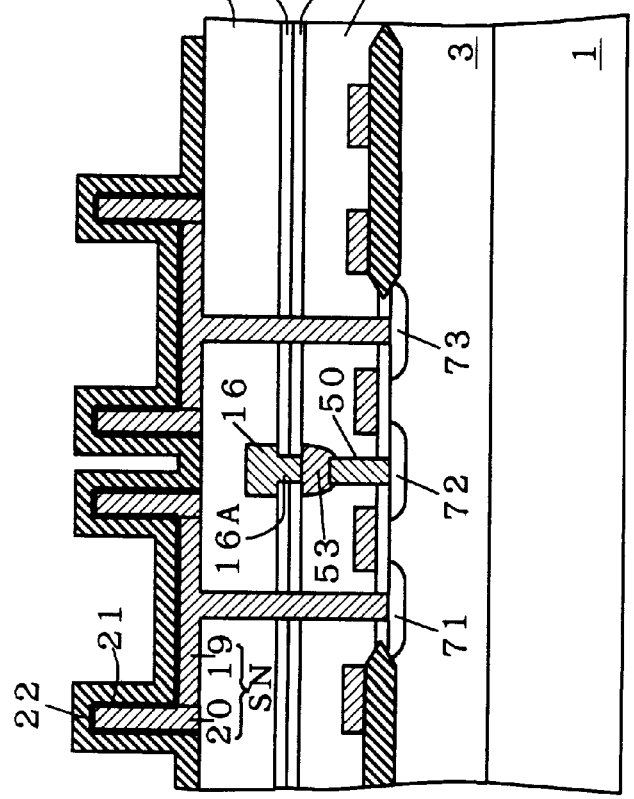

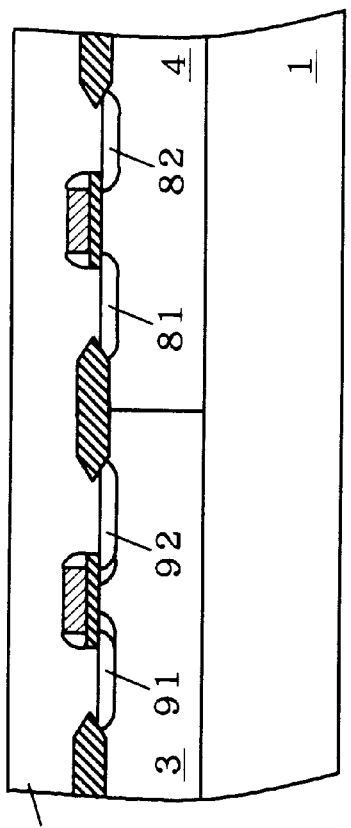
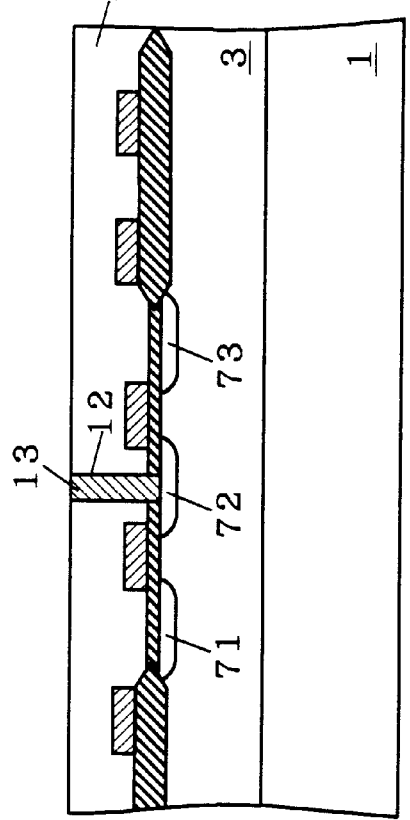
FIG. 40A (BACKGROUND ART)
FIG. 40B (BACKGROUND ART)

SEMICONDUCTOR DEVICE

BACKGROUND OF THE INVENTION

1. Field of the Invention

The present invention relates to semiconductor devices and manufacturing methods thereof, and particularly to a semiconductor device having a plurality of circuit parts with different structures, like a memory cell part and logic circuitry, mixed on one substrate, and a manufacturing method thereof.

2. Description of the Background Art

With the improvements toward higher integration and larger capacities in semiconductor devices, particularly in dynamic RAMs (DRAMs), three-dimensionalization of the memory cells have been studied after the 4M (Mega) DRAM generation for the purposes of maintaining soft-error resistance and securing capacitances of the capacitors. The structures for three-dimensional memory cells have been selected as the DRAM generation advances, and they are now being converged into stacked capacitor cells and trench capacitor cells.

In contrast with the trench capacitor cells in which a trench is formed in a silicon substrate to ensure the capacitances; of capacitors with the depth, capacitors are stacked on a silicon substrate in the stacked capacitor cells to ensure the capacitances of the capacitors with the height. Typical stacked capacitor cells include the thick-film stacked capacitor cells which have been used from the 16M DRAM generation, the cylindrical capacitor cells which have been used from the 64M DRAM generation, the Fin capacitor cells, the thick-film rough-surface capacitor cells, etc. Among these stacked capacitor cells, a structure and a fabrication process of a DRAM 90 having cylindrical capacitor cells will be described referring to FIGS. 37A to 46B.

FIGS. 37A, 38A, 39A, 40A, 41A, 42A, 43A, 44A, 45A and 46A are partial sectional views showing the memory cell part of the DRAM 90 and FIGS. 37B, 38B, 39B, 40B, 41B, 42B, 43B, 44B, 45B and 46B are partial sectional views showing the peripheral circuit part including sense amplifiers (amps), decoders, etc., formed around the memory cell part in the DRAM 90.

First, in the process step shown in FIGS. 37A and 37B, a field oxide film 2 is selectively formed in a P-type silicon semiconductor substrate 1.

Then P-type impurity ions and N-type impurity ions are selectively implanted by using resist (not shown) as a mask to form a P-type well region 3 in the memory cell part and a P-type well region 3 and an N-type well region 4 in the peripheral circuit part in the P-type silicon semiconductor substrate 1.

Next, a gate oxide film 5 is formed on the P-type well region 3 and the N-type well region 4 in the part where the field oxide film 2 is not formed and gate electrodes 6 are formed selectively on the gate oxide film 5. At this time, word lines 61 are formed on the field oxide film 2 in the same process step as the gate electrodes 6.

Then N-type impurity (As or P) ions are implanted to a low dose ($1\times10^{13}$ to $1\times10^{14}$ cm$^{-2}$) into the P-type well region 3 right under the gate oxide film 5 in the memory cell part by using the gate electrodes 6 as masks to selectively form N-type source/drain regions 71, 72, 73, and N-type source/drain regions 74, 75 are selectively formed in a similar process in the P-type well region 3 right under the gate oxide film 5 in the peripheral circuit part.

Next, in the process step shown in FIGS. 38A and 38B, an oxide film OX1 is formed all over the surface and resist R1 is formed except on the P-type well region 3 in the peripheral circuit part, and the oxide film OX1 is then etched back by using this resist R1 as a mask to form side wall oxide films 10 on both sides of the gate electrode 6 on the P-type well region 3 in the peripheral circuit part.

Subsequently, by using the gate electrode 6 and the side wall oxide films 10 on the P-type well region 3 in the peripheral circuit part and the resist R1 as masks, N-type impurity ions are implanted to a high dose ($1\times10^{15}$ to $4\times10^{15}$ cm$^{-2}$) into the N-type source/drain regions 74 and 75 to form N$^+$-type source/drain regions 91 and 92.

Next, after removing the resist R1, in the process step shown in FIGS. 39A and 39B, resist R2 is formed except on the N-type well region 4 in the peripheral circuit part and the oxide film OX1 is etched back by using the resist R2 as a mask to form side wall oxide films 10 on both sides of the gate electrode 6 on the N-type well region 4 in the peripheral circuit part.

Subsequently, by using the gate electrode 6 and the side wall oxide films 10 on the N-type well region 4 in the peripheral circuit part and the resist R2 as masks, P-type impurity (B or BF$_2$) ions are implanted to a high dose ($1\times10^{15}$ to $4\times10^{15}$ cm$^{-2}$) into the N-type well region 4 to form P$^+$-type source/drain regions 81 and 82.

Next, the resist R2 is removed, and then in the process step shown in FIGS. 40A and 40B, an oxide film is formed all over the surface and an interlayer insulating film 11 is formed by planarization. The interlayer insulating film 11 is referred to as an interlayer insulating film underlying bit lines so that it can be distinguished from other interlayer insulating films.

Next, a bit line contact hole 12 is formed through the interlayer insulating film 11 to reach the N-type source/drain region 72 in the memory cell part.

Next, a polysilicon layer, containing N-type impurities, is formed over the entire surface of the interlayer insulating film 11, and then the polysilicon layer is removed by CMP (Chemical Mechanical Polishing) except in the bit line contact hole 12 to form a polysilicon plug 13 in the bit line contact hole 12.

Next, in the process step shown in FIGS. 41A and 41B, bit line contact holes 14 are formed through the interlayer insulating film 11 to reach the N$^+$source/drain regions 91 and 92 and the P$^+$-type source/drain regions 81 and 82 in the peripheral circuit part. Then a metal layer of TiN (titanium nitride) or W (tungsten), or a multi-layered film thereof, is formed all over the interlayer insulating film 11 and the metal layer is then removed by CMP except in the bit line contact holes 14 to form metal plugs 15 in the bit line contact holes 14.

Next, in the process step shown in FIGS. 42A and 42B, a metal layer of TiN or W, or a multi-layered film thereof, is formed all over the interlayer insulating film 11 and patterned by photolithography and etching to form metal bit lines 16. The metal bit lines 16 are so patterned that they are connected to the polysilicon plug 13 and the metal plugs 15.

Although the metal bit lines 16 in the peripheral circuit part do not always function only as bit lines, they are so named because they are formed in the same process as the bit lines in the memory cell part. Also, the bit line contact holes 14 are so named because they are connected to the metal bit lines 16, though they are not always connected to bit lines.

Although not shown in FIGS. 37B, 38B, 39B, 40B, 41B and 42B, a TG (Transfer Gate) wiring is formed in the peripheral circuit part in the same fabrication process as the word lines 61 (i.e., the gate electrodes 6), for example. Since the TG wiring is formed in almost the same layer as the gate electrodes 6, it may be electrically connected with the metal bit lines 16 by using the bit line contact holes 14.

That is to say, in the process step shown in FIG. 41B, a bit line contact hole (almost the same as the bit line contact holes 14) reaching the TG wiring through the interlayer insulating film 11 may be formed at the same time when forming the bit line contact holes 14, and then a metal plug 15 is buried also in the bit line contact hole reaching the TG wiring at the same time when the metal plugs 15 are buried in the bit line contact holes 14.

Next, in the process step shown in FIGS. 43A and 43B, an oxide film is formed all over the surface of the interlayer insulating film 11 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 11 and 17 to reach the N-type source/drain regions 71 and 73 in the memory cell part at least.

Next, when a conductor layer for the formation of storage nodes is formed all over the interlayer insulating film 17 with N$^+$ polysilicon into which N-type impurities are introduced to a high concentration, for example, the conductor layer for the formation of storage nodes is also buried in the storage node contact holes 18 to form buried layers 31.

Then a thick insulating film is formed all over the surface and then the conductor layer for the formation of storage nodes and the thick insulating film are removed through a process of photolithography and etching, leaving bottom films 19 forming the bottom of the storage nodes and the thick insulating film on the bottom films 19. Now the thick insulating films on the bottom films 19 are called insulating films 26 for the formation of cylindrical capacitors.

Next, in the process step shown in FIGS. 44A and 44B, a conductor layer for the formation of storage nodes is formed again all over the surface and is selectively removed by etch back so that it is left only around the bottom films 19 and insulating films 26 for the formation of cylindrical capacitors. The remaining parts of the conductor layer for the formation of storage nodes form side films 20 serving as side walls of the storage nodes. The bottom films 19 and the side films 20 form storage nodes SN.

Next, only the insulating films 26 for the formation of cylindrical capacitors are removed and a capacitor gate insulating film 21 is formed on the surface of the bottom films 19 and the side films 20 in the process step shown in FIGS. 45A and 45B. Then a conductive film for the formation of cell plate is formed all over the surface and the conductive film for cell plate formation is left only in the memory cell part through a process of photolithography and etching. The remaining conductive film for the formation of cell plate forms a cell plate electrode 22.

Next, in the process step shown in FIGS. 46A and 46B, an oxide film is formed all over the surface and an interlayer insulating film 23 is formed by planarization. The interlayer insulating film 23 is called an interlayer insulating film underlying aluminum wiring so that it can be distinguished from other interlayer insulating films.

Next, an aluminum wiring contact hole 24A reaching the cell plate electrode 22 is formed in the memory cell part and aluminum wiring contact holes 24B reaching the metal bit lines 16 electrically connected to the N$^+$-type source/drain region 92 and the P$^+$-type source/drain region 81 are formed through the interlayer insulating films 23 and 17 in the peripheral circuit part.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then, through a process of photolithography and etching, aluminum wiring 25 is formed on the interlayer insulating film 23 in the memory cell part and the peripheral circuit part to obtain a DRAM 90 having cylindrical capacitor cells.

Although not shown in FIGS. 42B, 43B, 44B, 45B and 46B, a BL (Bit Line) wiring is formed in the same fabrication process as the metal bit lines 16 in the peripheral circuit part, for example. Since it is formed in almost the same layer as the bit lines 16, the BL wiring and the aluminum wiring 25 may be electrically connected by using the aluminum wiring contact holes 24B.

Generally, with highly-integrated and large-capacity DRAMs, high resolution is required in photolithography, and therefore the focus margin is reduced as trade off.

Accordingly, if the difference in level at the pattern step becomes larger over the focus margin as the degree of integration increases and the capacity becomes larger, it is then very difficult to form wirings by photolithography. Especially, with stacked capacitor cells which are formed by stacking capacitors on a silicon substrate, the difference in level at the pattern step is noticeable, and it is therefore essential to reduce the step height. The interlayer insulating film 11, the interlayer insulating film 17 and the interlayer insulating film 23 therefore undergo planarization as shown in FIGS. 46A and 46B.

However, such a planarization process tends to cause the problem that the thickness of the interlayer films from the aluminum wiring to the silicon substrate becomes too thick, and then it will be quite difficult to make contact holes for connecting the aluminum wiring and the silicon substrate, or the aluminum wiring and the TG wiring. Accordingly, as shown in FIGS. 46A and 46B, in the peripheral circuit part, the aluminum wiring and the silicon substrate, or the aluminum wiring and the TG wiring, are electrically connected by the metal plugs 15 buried in the bit line contact holes 14 through the metal bit lines 16 and BL wiring (not shown).

However, the use of the metal plugs 15 in the peripheral circuit part may cause such inconveniences as described below.

That is to say, after the bit line contact holes 14 have been made and the metal plugs 15 have been formed, completing the DRAM fabrication process requires the process steps for forming the metal bit lines 16, capacitors (storage nodes) SN, interlayer insulating film 17 underlying the capacitors, interlayer insulating film 23 underlying the aluminum wiring, etc., as has been described referring to FIGS. 42A to 46B.

Thermal processes around 800 to 850° C. for several tens of minutes are required for the formation of the interlayer insulating films 17, 23, sintering of the capacitor gate insulating film 21, and for electric activation of the polysilicon material. These thermal processes considerably increase the contact resistance at the interface between the metal plugs 15 buried in the bit line contact holes 14 in the peripheral circuit part and the silicon substrate, i.e., at the interface with the N$^+$-type source/drain regions 91 and 92 and the P$^+$-type source/drain regions 81 and 82, and also considerably increase the junction leakage current. For example, as compared with a thermal process at about 400° C. for several tens of minutes, the contact resistance is increased 10 times or more and the junction leakage current is increased 100 times or more. The reason will be considered below.

A thermal process at 800 to 850° C. causes metal atoms constituting the metal plugs 15 to aggregate at the interface between the metal plugs 15 buried in the bit line contact holes 14 and the silicon substrate, which results in formation of voids. It is supposed that the presence of voids reduces the contact area between the metal plugs 15 and the silicon substrate. In electric characteristics, this phenomenon appears as an increase in contact resistance.

It is also supposed that a thermal process at 800 to 850° C. causes metal atoms constituting the metal plugs 15 to diffuse into the silicon substrate at the interface between the metal plugs 15 buried in the bit line contact holes 14 and the silicon substrate to break pn junction in the silicon substrate. In electric characteristics, this phenomenon appears as an increase in junction leakage current. When the metal is aluminum or cobalt, the substrate side is spiked and dented, which is called spike phenomenon.

Further, a thermal process at 800 to 850° C. also causes impurity ions in the diffusion layer, i.e., the N$^+$-type source/drain regions 91 and 92 and the P$^+$-type source/drain regions 81 and 82, to diffuse into the silicon substrate. Then the impurity ion concentration decreases at the interface between the metal plugs 15 buried in the bit line contact holes 14 and the silicon substrate, i.e., at the interface with the N$^+$-type source/drain regions 91 and 92 and the P$^+$-type source/drain regions 81 and 82, which results in an increase in contact resistance, too.

SUMMARY OF THE INVENTION

According to the present invention, a semiconductor device comprises: a first contact hole formed through a first part of an interlayer insulating film formed on a silicon substrate, to reach a first semiconductor layer of a first conductivity type in a surface of the silicon substrate; a first buried layer buried in the first contact hole and composed of polysilicon containing an impurity of the first conductivity type; a first multi-layer wiring layer formed on the first buried layer and electrically connected to the first semiconductor layer through the first buried layer; a second contact hole formed through a second part of the interlayer insulating film to reach a second semiconductor layer of a second conductivity type in the surface of the silicon substrate; a second buried layer buried in the second contact hole and composed of polysilicon containing an impurity of the second conductivity type; and a second multi-layer wiring layer formed on the second buried layer and electrically connected to the second semiconductor layer through the second buried layer; wherein the first and second multi-layer wiring layers at least comprise a barrier metal layer formed on the interlayer insulating film and a polysilicon layer formed on the barrier metal layer and composed of polysilicon containing an impurity of the first conductivity type, and the first buried layer is directly connected to the polysilicon layer.

According to the semiconductor device of the present invention, the first and second multi-layer wiring layers and the first and second semiconductor layers of first and second conductivity types are electrically connected through the first and second buried layers composed of polysilicon which contains first and second conductivity type impurities, respectively. Accordingly, even when a thermal process is applied, the phenomenon in which metal atoms aggregate at the interface between the first and second buried layers and the silicon substrate does not occur and therefore no voids are formed. Hence, the contact resistance between the silicon substrate and the first and second buried layers is not increased. Further, when impurity ions in the first and second semiconductor layers diffuse into the silicon substrate in a thermal process, the decrease in impurity ion concentration can be compensated for by impurity ions contained in the first and second buried layers, and the contact resistance is therefore not increased. Moreover, the absence of metal atoms in the first and second buried layers avoids the problem that metal atoms diffuse into the silicon substrate to break pn junction in the first and second semiconductor layers to increase the junction leakage current. Further, the presence of the barrier metal layer on the second buried layer prevents the second buried layer from coming into direct contact with the polysilicon layer, thus preventing mutual diffusion of impurities of different conductivity types.

Preferably, according to the present invention, in the semiconductor device, the second buried layer comprises a silicide film at a contact surface with the barrier metal layer.

According to the semiconductor device of the present invention, the presence of the silicide layer on the contact surface between the second buried layer and the barrier metal layer reduces the contact resistance, as compared with the case in which the second buried layer and the barrier metal layer are in direct contact.

According to the present invention, a semiconductor device comprises: first, second, and third interlayer insulating films stacked in order on a silicon substrate; a first contact hole formed through a first part of the first interlayer insulating film to reach a first semiconductor layer of a first conductivity type in a surface of the silicon substrate; a first recessed polysilicon plug having its one end electrically connected to the first semiconductor layer and its other end located in a recessed position in the first contact hole, and composed of polysilicon containing an impurity of the first conductivity type; a first polysilicon plug composed of the same material as the first recessed polysilicon plug, and buried in the first contact hole in a part from a main surface of the first interlayer insulating film to the other end of the first recessed polysilicon plug; a second contact hole formed through a second part of the first interlayer insulating film and the second interlayer insulating film thereon to reach a second semiconductor layer of a second conductivity type in the surface of the silicon substrate; a second recessed polysilicon plug having its one end electrically connected to the second semiconductor layer and its other end located in a recessed position in the second contact hole, and composed of polysilicon containing an impurity of the second conductivity type; and a second polysilicon plug buried in the second contact hole in a part from a main surface of the second interlayer insulating film to the other end of the second recessed polysilicon plug, and composed of the same material as the second recessed polysilicon plug; wherein the first and second contact holes respectively comprise first and second enlarged contact parts whose opening diameter in the parts in which the first and second polysilicon plugs are buried is larger than opening diameter of the parts in which the first and second recessed polysilicon plugs are buried, and a wiring layer is formed above the third interlayer insulating film.

According to the semiconductor device of the present invention, the first and second enlarged contact parts having larger opening diameter than first and second recessed polysilicon plugs are formed on the first and second recessed polysilicon plugs, and the first and second polysilicon plugs are buried therein. This allows larger alignment margin when electrically connecting a wiring layer. Further, since the first polysilicon plug is formed below the second and third interlayer insulating films and the second polysilicon plug is formed below the third interlayer insulating film, the wiring layer formed above the third interlayer insulating film does not come into direct contact with the first and second polysilicon plugs. When first and second contact holes are provided between wiring layers, the wiring layer interval can be reduced, leading to reduction in semiconductor device area.

Preferably, according to the present invention, in the semiconductor device, the semiconductor device is a peripheral circuit part which operates in relation to a data holding part for holding data by accumulating charge in a capacitor.

According to the semiconductor device of the present invention, in a sense amp zone in a DRAM, where the first or second contact hole is often formed between wiring layers, the semiconductor device area can be reduced.

The present invention is also directed to a method for manufacturing a semiconductor device having first and second contact holes, first and second buried layers, a first semiconductor layer of a first conductivity type, and a second semiconductor layer of a second conductivity type. According to the present invention, the semiconductor device manufacturing method comprises the steps of: (a) selectively forming the first and second semiconductor layers in a surface of a silicon substrate; (b) forming first and second parts of an interlayer insulating film on the silicon substrate; (c) forming the second contact hole reaching the second semiconductor layer through the second part of the interlayer insulating film; (d) forming the second buried layer by filing the second contact hole with polysilicon containing an impurity of the second conductivity type; (e) forming a barrier metal layer all over the interlayer insulating film; (f) forming the first contact hole reaching the first semiconductor layer through the first part of the interlayer insulating film and the barrier metal layer thereon; (g) at the same time when forming a polysilicon layer containing an impurity of the first conductivity type all over the barrier metal layer, filling the first contact hole to form the first buried layer; and (h) patterning the barrier metal layer and the polysilicon layer so that the barrier metal layer and the polysilicon layer remain on the first and second buried layers to form first and second multi-layer wiring layers at least comprising the barrier metal layer and the polysilicon layer.

According to the semiconductor device manufacturing method of the present invention, at the same time when forming the polysilicon layer containing a first conductivity type impurity all over the barrier metal layer, the first contact hole is filled to form the first buried layer, and the polysilicon layer is left unremoved. Accordingly, the process of removing the polysilicon layer in the formation of the first buried layer, e.g., a CMP process, is not required, which enables fabrication cost reduction.

Preferably, according to the present invention, in the semiconductor device manufacturing method, the step (e) comprises the step (e-1) of forming a silicide film on a surface of the second buried layer which is on the opposite side to the second semiconductor layer.

According to the semiconductor device manufacturing method of the present invention, a silicide layer is formed at the contact surface between the second buried layer and the barrier metal layer, which provides a semiconductor device with lower contact resistance as compared with the case in which the second buried layer and the barrier metal layer are in direct contact.

Preferably, according to the present invention, in the semiconductor device manufacturing method, the step (e-1) comprises the steps of (e-1-1) forming a Ti (titanium) or Co (cobalt) layer all over the interlayer insulating film and then forming a TiN (titanium nitride) layer all over the Ti layer or Co layer; (e-1-2) applying an RTA (Rapid Thermal Anneal) process at 400 to 500° C. for 30 to 60 seconds in an atmosphere of nitrogen; (e-1-3) removing the deposition layer including the Ti layer or Co layer formed in a part except on the second buried layer; and (e-1-4) forming the barrier metal layer all over the interlayer insulating film and then applying an RTA process at 800 to 1000° C. for 30 to 60 seconds in an atmosphere of nitrogen.

According to the semiconductor device manufacturing method of the present invention, the metal compound obtained in the RTA process in step (e-1-2) can be easily removed. Accordingly, the metal compound is completely removed except on the second buried layer in step (e-1-3), and the silicide layer can be formed only on the second buried layer in step (e-1-4).

According to the present invention, a semiconductor device manufacturing method comprises the steps of: (a) selectively forming first and second semiconductor layers of first and second conductivity types in a surface of a silicon substrate; (b) forming first and second parts of a first interlayer insulating film on the silicon substrate; (c) forming a first contact hole reaching the first semiconductor layer through the first part of the first interlayer insulating film; (d) filling the first contact hole with polysilicon containing an impurity of the first conductivity type to form a first buried layer having its one end being in contact with the first semiconductor layer; (e) etching the first buried layer until its other end is recessed in the first contact hole to form a first recessed polysilicon plug buried in the first contact hole; (f) by wet etching, enlarging opening diameter of the first contact hole in a part from a main surface of the first interlayer insulating film to the other end of the first recessed polysilicon plug to a size larger than opening diameter of the part in which the first recessed polysilicon plug is buried to form a first enlarged contact part; (g) filling the first enlarged contact part with polysilicon containing an impurity of the first conductivity type to form a first polysilicon plug; (h) forming a second interlayer insulating film all over the first interlayer insulating film; (i) forming a second contact hole reaching the second semiconductor layer through the second part of the first interlayer insulating film and the second interlayer insulating film thereon; (j) filling the second contact hole with polysilicon containing an impurity of the second conductivity type to form a second buried layer having its one end being in contact with the second semiconductor layer; (k) etching the second buried layer until its other end is recessed in the second contact hole to form a second recessed polysilicon plug buried in the second contact hole; (l) by wet etching, enlarging opening diameter of the second contact hole in a part from a main surface of the second interlayer insulating film to the other end of the second recessed polysilicon plug to a size larger than opening diameter of the part in which the second recessed polysilicon plug is buried to form a second enlarged contact part; (m) filling the second enlarged contact part with polysilicon containing an impurity of the second conductivity type to form a second polysilicon plug; and (n) forming a third interlayer insulating film all over the second interlayer insulating film.

According to the semiconductor device manufacturing method of the present invention, first and second enlarged contact parts having larger opening diameter than the first and second recessed polysilicon plugs are formed on the first and second recessed polysilicon plugs, and the first and second polysilicon plugs can be buried therein. This allows larger alignment margin when electrically connecting wiring layer. Further, since the first polysilicon plug can be formed below the second and third interlayer insulating films and the second polysilicon plug can be formed below the third interlayer insulating film, the wiring layer formed above the third interlayer insulating film does not come into direct contact with the first and second polysilicon plugs. When the first or second contact hole is provided between wiring layers, the wiring layer interval can be reduced, thus providing a semiconductor device with reduced area.

Preferably, according to the present invention, in the semiconductor device manufacturing method, the step (e) comprises the step of etching the first buried layer under an etching condition in which etching selectivity of the first buried layer with respect to the first interlayer insulating film is 5 to 20, and the step (k) comprises the step of etching the second buried layer under an etching condition in which etching selectivity of the second buried layer with respect to the first and second interlayer insulating films is 5 to 20.

According to the semiconductor device manufacturing method, the first and second buried layers are etched under etching conditions in which the etching selectivity for the first buried layer with respect to the first interlayer insulating film and the etching selectivity for the second buried layer with respect to the first and second interlayer insulating films are 5 to 20. This enables stable formation of the first and second recessed polysilicon plugs both in structural and processing aspects.

Preferably, according to the present invention, in the semiconductor device manufacturing method, the step (e) comprises the step of etching the first buried layer until the other end of the first recessed polysilicon plug reaches half of the depth of the first contact hole or lower, and the step (k) comprises the step of etching the second buried layer until the other end of the second recessed polysilicon plug reaches half of the depth of the second contact hole or lower.

According to the semiconductor device manufacturing method of the present invention, etching the first recessed polysilicon plug until its other end reaches half of the depth of the first contact hole or lower, and etching the second recessed polysilicon plug until its other end reaches half of the depth of the second contact hole or lower enable stable formation of the first and second recessed polysilicon plugs in structural aspect.

The present invention has been made to solve the above-described problems. In a semiconductor device having a plurality of circuit parts with different structures and in which layers (semiconductor layer, conductor layer) provided above and below an interlayer insulating film are electrically connected through plugs buried in the interlayer insulating film in the respective circuit parts, an object of the present invention is to provide a semiconductor device and manufacturing method capable of preventing an increase in contact resistance between the plug and the semiconductor layer and an increase in junction leakage current in the semiconductor layer to which the plug is connected, and also capable of reducing manufacturing cost and down-sizing the device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A to 10B are sectional views showing a process of manufacturing a semiconductor device having a dual polysilicon plug structure.

FIGS. 11A to 17B are sectional views showing a process of manufacturing a semiconductor device according to a first preferred embodiment of the present invention.

FIGS. 19A to 29B are sectional views showing a process of manufacturing a semiconductor device according to a second preferred embodiment of the present invention.

FIGS. 37A to 46B are sectional views showing a conventional semiconductor device manufacturing process.

DESCRIPTION OF THE PREFERRED EMBODIMENTS

<Introduction>

For the purpose of preventing an increase in contact resistance between plugs and semiconductor layers and an increase in junction leakage current in semiconductor layers to which plugs are connected, the inventor has developed the structure for semiconductor devices described hereinafter. Now a structure and manufacturing method for a dynamic RAM (DRAM) 100 having cylindrical capacitor cells will be described referring to FIGS. 1A to 10B. The structure of the DRAM 100 is shown in FIGS. 10A and 10B showing the final process step.

FIGS. 1A, 2A, 3A, 4A, 5A, 6A, 7A, 8A, 9A and 10A are partial sectional views showing the memory cell part (data holding part) of the DRAM 100 and FIGS. 1B, 2B, 3B, 4B, 5B, 6B, 7B, 8B, 9B and 10B are partial sectional views showing the peripheral circuit part including sense amplifiers (amps), decoders, etc., formed around the memory cell part in the DRAM 100.

Figure 1B:
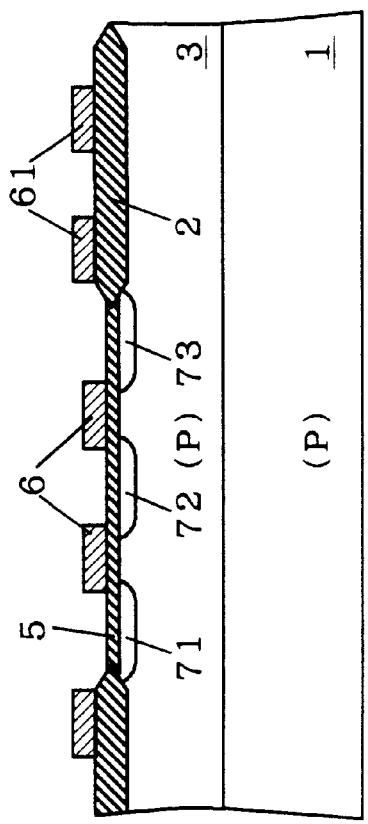
Figure 1A:
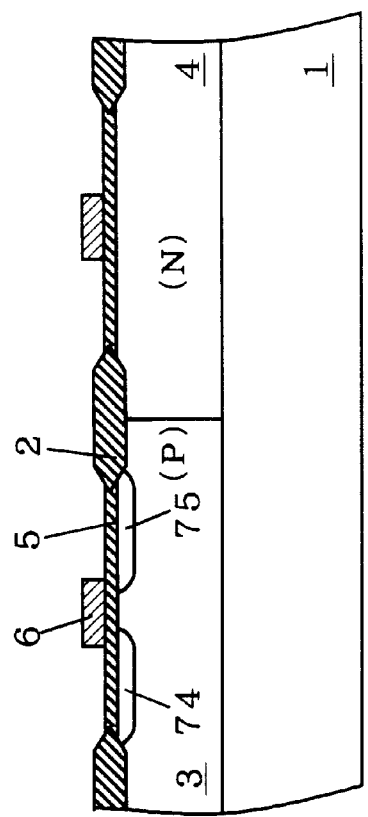

First, in the process step shown in FIGS. 1A and 1B, a field oxide film 2 is selectively formed in a P-type silicon semiconductor substrate 1.

Then P-type impurity ions and N-type impurity ions are selectively implanted by using resist (not shown) as a mask to form a P-type well region 3 in the memory cell part and a P-type well region 3 and an N-type well region 4 in the peripheral circuit part in the P-type silicon semiconductor substrate 1.

Next, a gate oxide film 5 is formed on the P-type well region 3 and the N-type well region 4 in the part where the field oxide film 2 is not formed and gate electrodes 6 are formed selectively on the gate oxide film 5. At this time, word lines 61 are formed on the field oxide film 2 in the same process step as the gate electrodes 6.

Then N-type impurity (As or P) ions are implanted to a low dose ($1 \times 10^{13}$ to $1 \times 10^{14}$ cm$^{-2}$) into the P-type well region 3 right under the gate oxide film 5 in the memory cell part by using the gate electrodes 6 as masks to selectively form N-type source/drain regions 71, 72, 73, and N-type source/drain regions 74, 75 are selectively formed in a similar process in the P-type well region 3 right under the gate oxide film 5 in the peripheral circuit part.

Figure 2B:
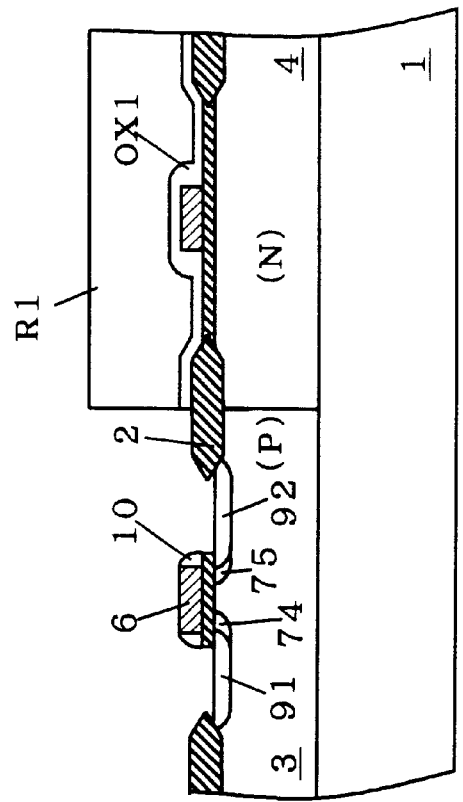
Figure 2A:
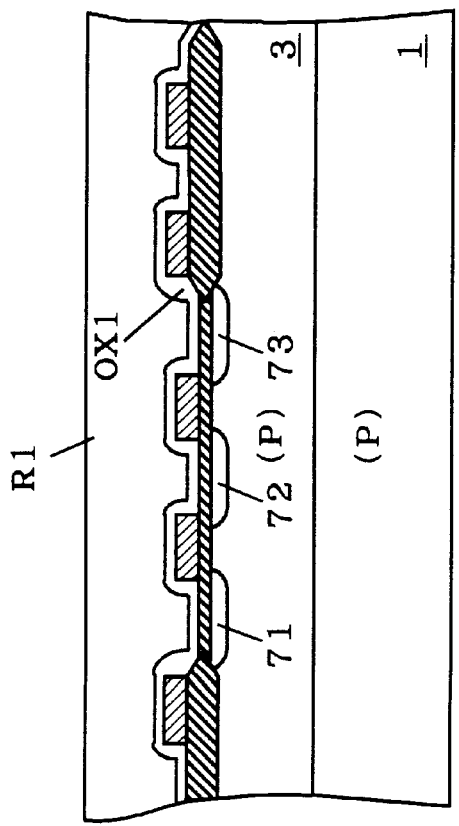

Next, in the process step shown in FIGS. 2A and 2B, an oxide film OX1 is formed all over the surface and resist R1 is formed except on the P-type well region 3 in the peripheral circuit part, and the oxide film OX1 is then etched back by using this resist R1 as a mask to form side wall oxide films 10 on both sides of the gate electrode 6 on the P-type well region 3 in the peripheral circuit part.

Subsequently, by using the gate electrode 6 and the side wall oxide films 10 on the P-type well region 3 in the peripheral circuit part and the resist R1 as masks, N-type impurity ions are implanted to a high dose ($1\times10^{15}$ to $4\times10^{15}$ cm$^{-2}$) into the N-type source/drain regions 74 and 75 to form N$^+$-type source/drain regions 91 and 92.

Figure 3B:
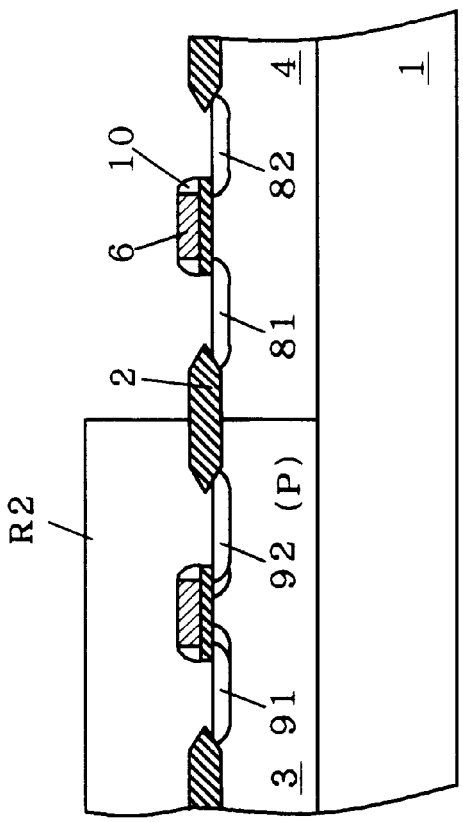
Figure 3A:
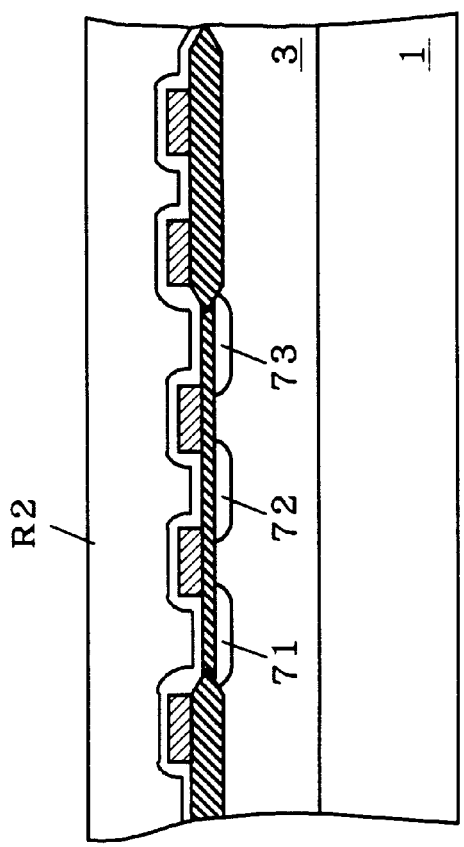

Next, after removing the resist R1, in the process step shown in FIGS. 3A and 3B, resist R2 is formed except on the N-type well region 4 in the peripheral circuit part and the oxide film OX1 is etched back by using the resist R2 as a mask to form side wall oxide films 10 on both sides of the gate electrode 6 on the N-type well region 4 in the peripheral circuit part.

Subsequently, by using the gate electrode 6 and the side wall oxide films 10 on the N-type well region 4 in the peripheral circuit part and the resist R2 as masks, P-type impurity (B or BF$_2$) ions are implanted to a high dose ($1\times10^{15}$ to $4\times10^{15}$ cm$^{-2}$) into the N-type well region 4 to form P$^+$-type source/drain regions 81 and 82.

Figure 4B:
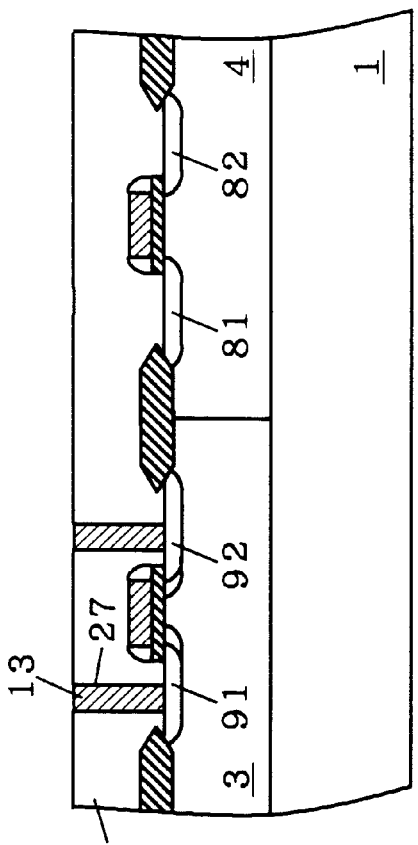
Figure 4A:
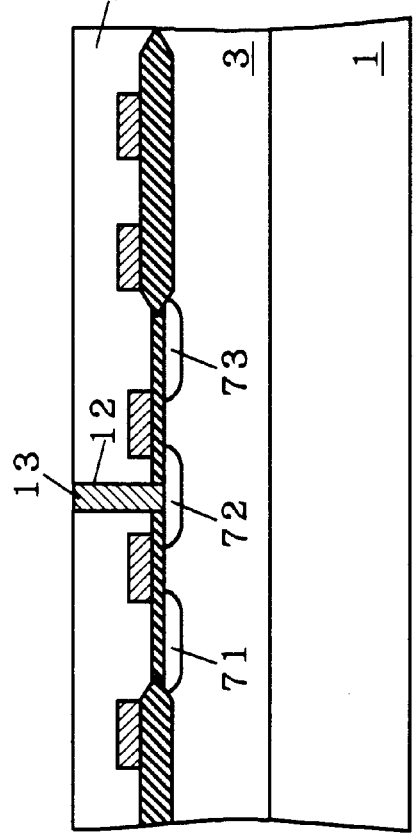

Next, the resist R2 is removed, and then in the process step shown in FIGS. 4A and 4B, an oxide film is formed all over the surface and an interlayer insulating film 11 is formed by planarization. The interlayer insulating film 11 is referred to as an interlayer insulating film underlying bit lines so that it can be distinguished from other interlayer insulating films.

While the interlayer insulating film 11 and interlayer insulating films 17 and 23 shown later are insulating films formed with the same material simultaneously in the memory cell part and the peripheral circuit part, the parts formed on the P-type well region 3 are called a first part and the parts formed on the N-type well region 4 are called a second part for distinction between the portions formed in the peripheral circuit part.

Next, a bit line contact hole 12 is formed through the interlayer insulating film 11 to reach the N-type source/drain region 72 in the memory cell part by an anisotropic etching like RIE (Reactive Ion Etching). In the peripheral circuit part, bit line contact holes 27 are formed to reach the N$^+$-type source/drain regions 91 and 92.

Next, a polysilicon layer, containing N-type impurities, is formed over the entire surface of the interlayer insulating film 11, and then the polysilicon layer is removed by CMP (Chemical Mechanical Polishing) except in the bit line contact holes 12 and 27 to form polysilicon plugs 13 in the bit line contact holes 12 and 27.

Figure 5A:
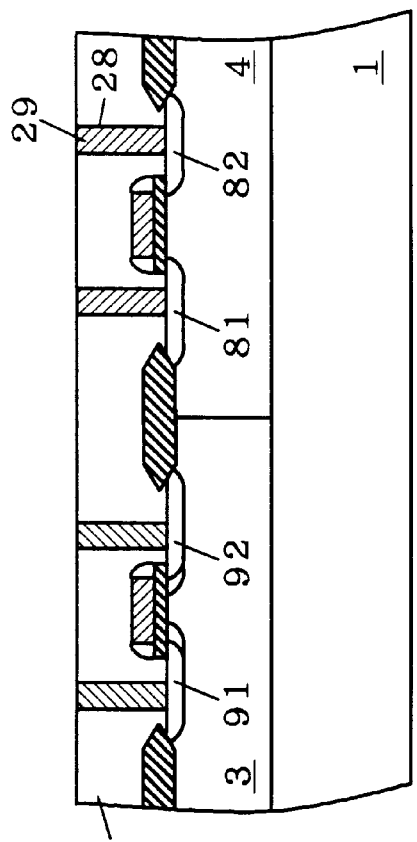
Figure 5B:
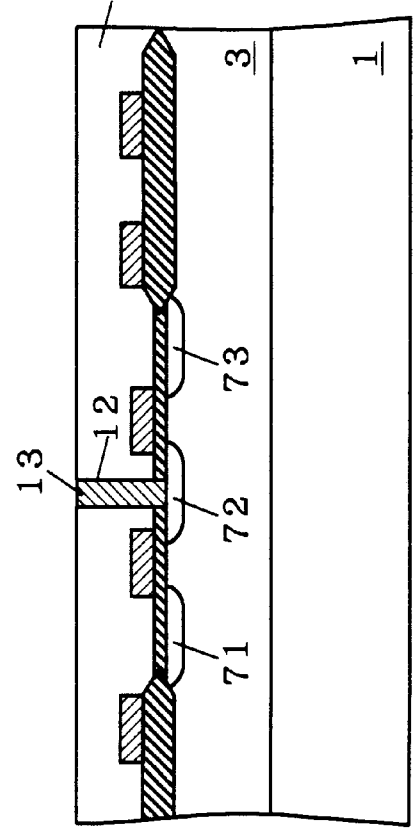

Next, in the process step shown in FIGS. 5A and 5B, bit line contact holes 28 passing through the interlayer insulating film 11 are formed by an anisotropic etching such as RIE to reach the P$^+$-type source/drain regions 81 and 82 in the peripheral circuit part. Then a polysilicon layer, containing P-type impurities, is formed all over the surface of the interlayer insulating film 11 and the polysilicon layer is then removed by CMP except in the bit line contact holes 28 to form polysilicon plugs 29 in the bit line contact holes 28.

Figure 6B:
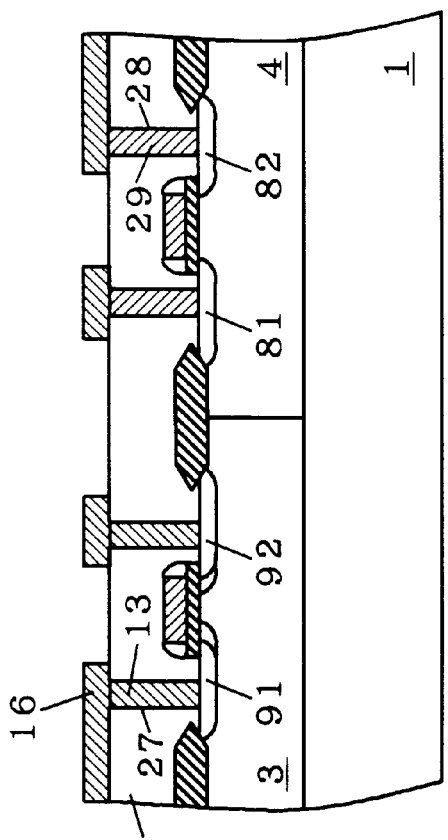
Figure 6A:
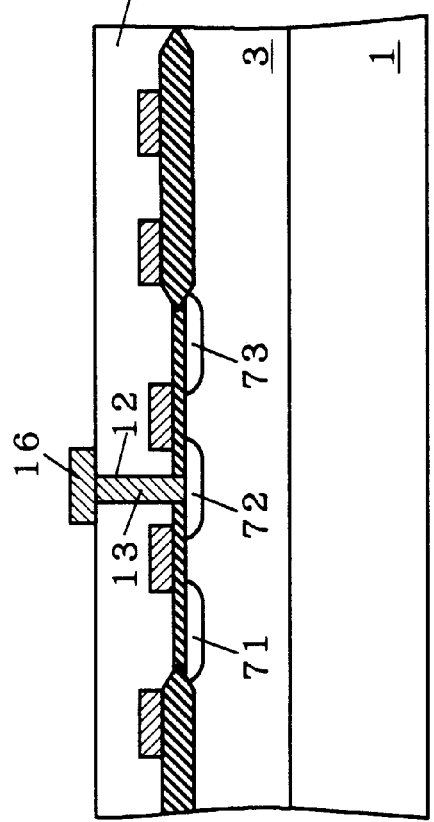

Subsequently, as shown in FIGS. 6A and 6B, a metal layer of TiN (titanium nitride) or W (tungsten), or a multi-layered film thereof, is formed all over the interlayer insulating film 11, and the metal layer (or the multi-layered metal film) is patterned by photolithography and etching to form metal bit lines 16 electrically connected to the polysilicon plugs 13 and 29.

Although the metal bit lines 16 in the peripheral circuit part do not always function only as bit lines, they are so named because they are formed in the same process step as the bit lines in the memory cell part. Also, the bit line contact holes 27 and 28 are so named because they are connected to the metal bit lines 16, though they are not always connected to bit lines.

Although not shown in FIGS. 1B, 2B, 3B, 4B, 5B and 6B, a TG (Transfer Gate) wiring is formed in the peripheral circuit part in the same fabrication process as the word lines 61 (i.e., the gate electrodes 6), for example. Since the TG wiring is formed in almost the same layer as the gate electrodes 6, it may be electrically connected with the metal bit lines 16 by using the bit line contact holes 27 and 28.

That is to say, in the process step shown in FIGS. 4B and 5B, a bit line contact hole (almost the same as the bit line contact holes 27 and 28) reaching the TG wiring through the interlayer insulating film 11 may be formed at the same time when forming the bit line contact holes 27 and 28, and then the polysilicon plug 13 or 29 is buried also in the bit line contact hole reaching the TG wiring at the same time when the polysilicon plugs 13 and 29 are buried in the bit line contact holes 27 and 28.

Next, in the process step shown in FIGS. 7A and 7B, an oxide film is formed all over the surface of the interlayer insulating film 11 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 11 and 17 to reach the N-type source/drain regions 71 and 73 in the memory cell part at least.

Next, when a conductor layer for the formation of storage nodes is formed all over the interlayer insulating film 17 with N$^+$ polysilicon into which N-type impurities are introduced to a high concentration, for example, the conductor layer for the formation of storage nodes is also buried in the storage node contact holes 18 to form buried layers 31.

A thick insulating film is then formed all over the surface and then the conductor layer for the formation of storage nodes and the thick insulating film are removed through a process of photolithography and etching, leaving bottom films 19 forming the bottom of the storage nodes and the thick insulating film on the bottom films 19. Now the thick insulating film on the bottom films 19 is called insulating films 26 for the formation of cylindrical capacitors.

Figure 8A:
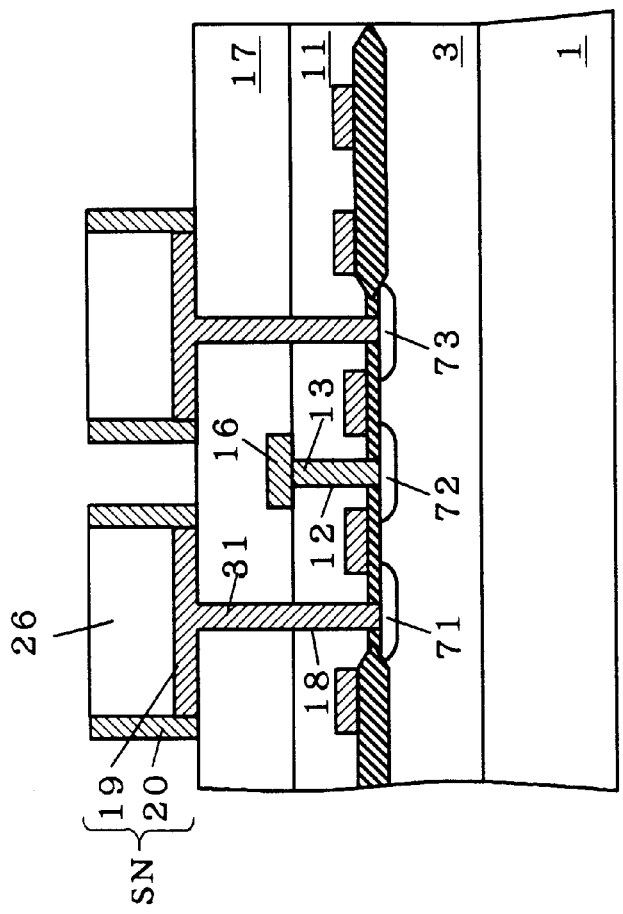
Figure 8B:
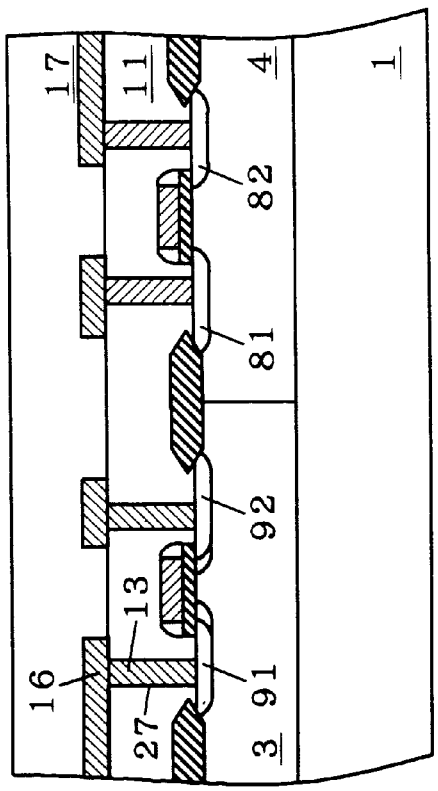

Next, in the process step shown in FIGS. 8A and 8B, a conductor layer for the formation of storage nodes is formed again all over the surface and is selectively removed by etch back, leaving the conductor layer for storage node formation only around the bottom films 19 and the insulating films 26 for cylindrical capacitor formation. The remaining parts of the conductor layer for storage node formation serve as side films 20 forming the side walls of the storage nodes. The bottom films 19 and the side films 20 form storage nodes SN.

Figure 9A:
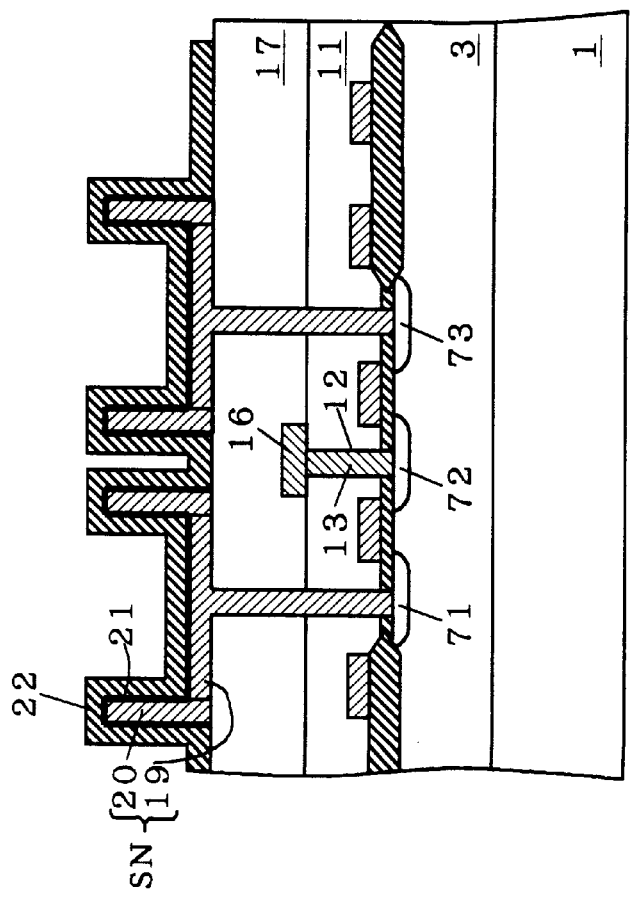
Figure 9B:
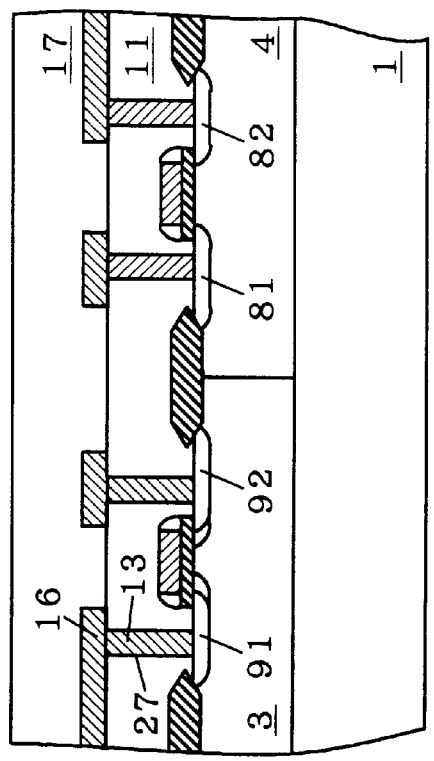
Figure 10A:
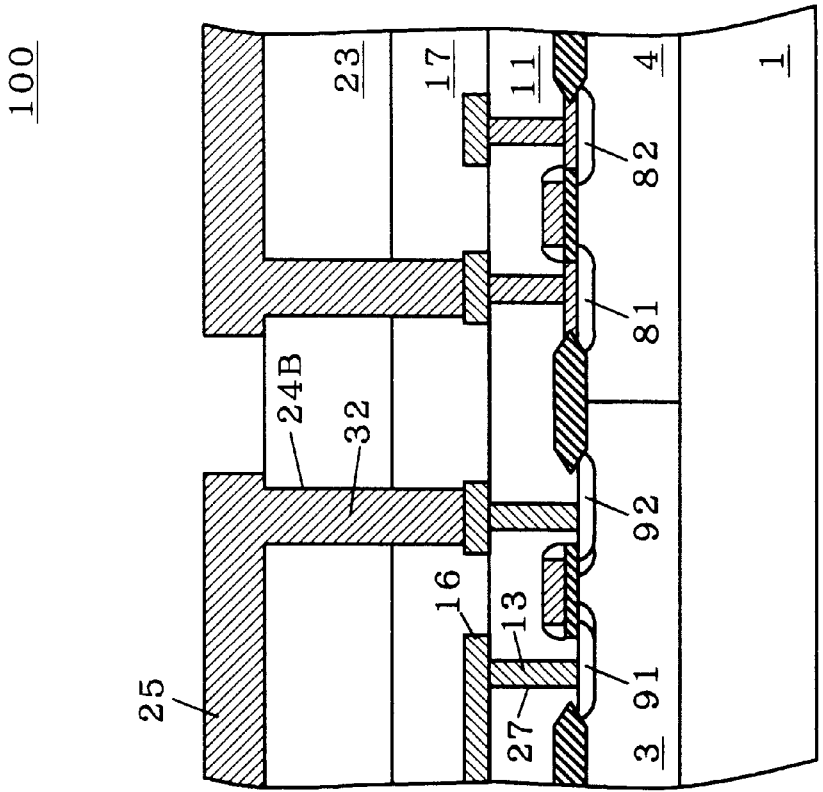
Figure 10B:
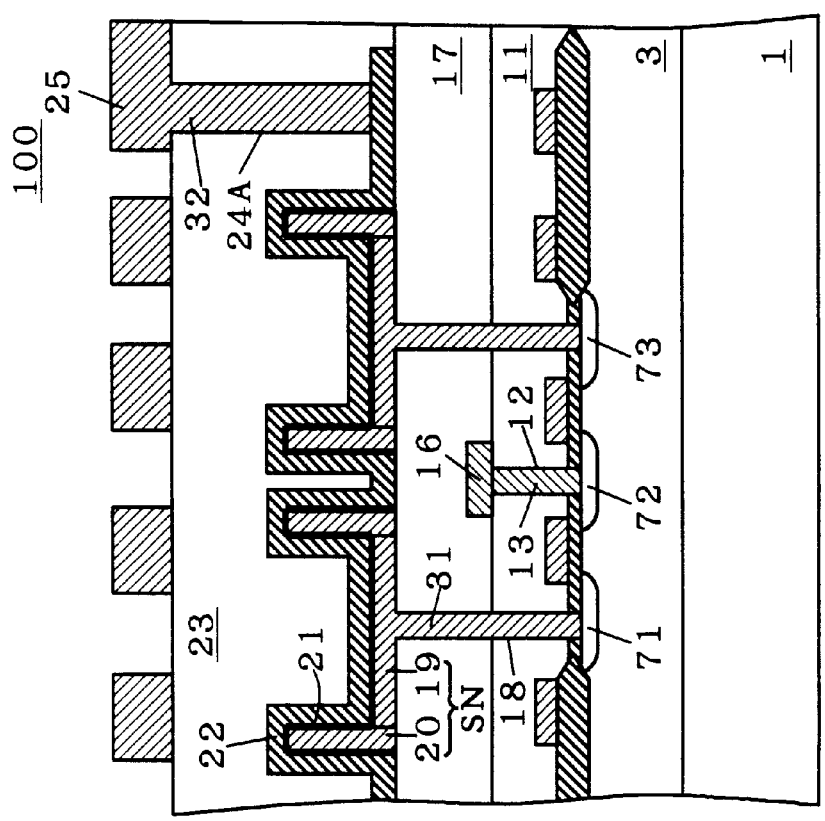

Next, only the insulating films 26 for cylindrical capacitor formation are removed and then a capacitor gate insulating film 21 is formed on the surface of the bottom films 19 and the side films 20 in the process step shown in FIGS. 9A and 9B. A conductive film for the formation of cell plate is then formed all over the surface and the conductive film for cell plate formation is left only in the memory cell part through a process of photolithography and etching. The remaining conductive film for cell plate formation forms a cell plate electrode 22.

Next, in the process step shown in FIGS. 10A and 10B, an oxide film is formed all over the surface and an interlayer insulating film 23 is formed by planarization. The interlayer insulating film 23 is called an interlayer insulating film underlying aluminum wiring so that it can be distinguished from other interlayer insulating films.

Next, an aluminum wiring contact hole 24A is formed to reach the cell plate electrode 22 in the memory cell part and aluminum wiring contact holes 24B are formed through the interlayer insulating films 23 and 17 to reach the metal bit lines 16 electrically connected to the $N^+$-type source/drain region 92 and the $P^+$-type source/drain region 81 in the peripheral circuit part.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then through a process of photolithography and etching, an aluminum wiring 25 is formed on the interlayer insulating film 23 in the memory cell part and the peripheral circuit part to obtain a DRAM 100 having cylindrical capacitor cells.

Although not shown in FIGS. 6B, 7B, 8B, 9B and 10B, a BL (Bit Line) wiring is formed in the same fabrication process as the metal bit lines 16 in the peripheral circuit part, for example. Since it is formed in almost the same layer as the bit lines 16, the BL wiring and the aluminum wiring 25 may be electrically connected by using the aluminum wiring contact holes 24B.

In the DRAM 100 described above, the dual polysilicon plug structure in which the metal bit lines 16 and the $N^+$-type source/drain regions 91 and 92 and the $P^+$-type source/drain regions 81 and 82 are electrically connected through two kinds of polysilicon plugs 13 and 29 having different conductivity types in the peripheral circuit part solves the problems of conventional semiconductor devices.

That is to say, for the problem of an increase in contact resistance at the interface between the silicon substrate ($N^+$-type source/drain regions 91 and 92 and the $P^+$-type source/drain regions 81 and 82) and the metal plugs 15, the use of polysilicon plugs 13 and 29 in place of the metal plugs 15 avoids the phenomenon that the metal atoms aggregate at the interface between the polysilicon plugs 13 and 29 and the silicon substrate in a thermal process. Then voids are not formed and therefore the contact resistance between the silicon substrate and the polysilicon plugs 13 and 29 does not increase.

Further, for the problem of an increase in contact resistance caused because impurity ions in the diffusion layer, i.e., the $N^+$-type source/drain regions 91 and 92 and the $P^+$-type source/drain regions 81 and 82, diffuse into the silicon substrate in thermal process and then the impurity ion concentration at the interface between the metal plugs 15 and the silicon substrate decreases, impurity ions contained in the polysilicon plugs 13 and 29 can compensate for the reduction in impurity ion concentration in the diffusion layer ($N^+$-type source/drain regions 91 and 92 and the $P^+$-type source/drain regions 81 and 82). That is to say, the polysilicon plugs 13 containing N-type impurities are connected to the $N^+$-type source/drain regions 91 and 92, and the polysilicon plugs 29 containing P-type impurities are connected to the $P^+$-type source/drain regions 81 and 82, so that, in thermal processing, the N-type impurities and P-type impurities diffuse from the polysilicon plugs 13 and 29 into the $N^+$-type source/drain regions 91 and 92 and the $P^+$-type source/drain regions 81 and 82 to compensate for the impurities diffused into the silicon substrate from the $N^+$-type source/drain regions 91 and 92 and the $P^+$-type source/drain regions 81 and 82, and therefore the contact resistance is not increased.

For the problem of an increase in junction leakage current due to the phenomenon that metal atoms constituting the metal plugs 15 diffuse into the silicon substrate at the interface between the metal plugs 15 and the silicon substrate to break pn junction in the silicon substrate, the use of the polysilicon plugs 13 and 29 in place of the metal plugs 15 can avoid the phenomenon that metal atoms diffuse into the silicon substrate in a thermal process to break pn junction in the diffusion layer, though impurity ions in the polysilicon plugs 13 and 29 may diffuse into the silicon substrate. Then the junction leakage current does not increase.

The use of the dual polysilicon plug structure in the peripheral circuit part provides the above-described functions and effects. However, when burying the polysilicon plugs 13 and 29 into the bit line contact holes 27 and 28, the processes must be performed in different steps, by using CMP process each time, which may lead to an increase in fabrication cost.

The inventor has developed a semiconductor device having improved dual polysilicon plug structure in view of fabrication cost reduction, whose structure and manufacturing method will now be described.

<A. First Preferred Embodiment>

<A-1. Manufacturing Process>

As a first preferred embodiment according to the present invention, the structure and manufacturing process of a DRAM 100A having cylindrical capacitor cells will be described referring to FIGS. 11A to 17B. The process steps performed before obtaining the structure shown in FIGS. 11A and 11B are the same as those shown in FIGS. 1A to 3B described in the method for manufacturing the DRAM 100, which are therefore not described again. The structure of the DRAM 100A is shown in FIGS. 17A and 17B showing the final process step.

FIGS. 11A, 12A, 13A, 14A, 15A, 16A and 17A are partial sectional views showing the memory cell part (data holding part) of the DRAM 100A, and FIGS. 11B, 12B, 13B, 14B, 15B, 16B and 17B are partial sectional views showing the peripheral circuit part including sense amps, decoders, etc., formed around the memory cell part in the DRAM 100A.

As has been described referring to FIGS. 3A and 3B, the $P^+$-type source/drain regions 81 and 82 are formed in the N-type well region 4, and then, as shown in the process step shown in FIGS. 11A and 11B, an oxide film is formed all over the surface and the interlayer insulating film 11 is formed by planarization. The interlayer insulating film 11 is called an interlayer insulating film underlying bit lines so that it can be distinguished from other interlayer insulating films.

While the interlayer insulating film 11 and interlayer insulating films 17 and 23 shown later are insulating films formed with the same material simultaneously in the memory cell part and the peripheral circuit part, the parts formed on the P-type well region 3 are called a first part and the parts formed on the N-type well region 4 are called a second part for distinction between the portions formed in the peripheral circuit part.

Subsequently, bit line contact holes 28 (second contact holes) passing through the interlayer insulating film 11 are formed by an anisotropic etching like RIE to reach the P$^+$-type source/drain regions 81 and 82 (second semiconductor layer) in the peripheral circuit part. Next, a polysilicon layer, containing P-type impurities, is formed all over the interlayer insulating film 11, and the polysilicon layer is then removed by CMP except in the bit line contact holes 28 to form polysilicon plugs 29 (second buried layers) in the bit line contact holes 28.

A metal layer of Ti (titanium) or (Co (cobalt) is formed all over the surface of the interlayer insulating film 11 and then a TiN (titanium nitride) layer is formed all over the interlayer insulating film 11. A low-temperature RTA (Rapid Thermal Anneal) processing is then applied at 400 to 500° C. for about 30 to 60 seconds in an atmosphere of nitrogen, for example, to form TiSi, or CoSi only on the polysilicon plugs 29. Unreacted Ti, Co, TiN are removed.

Subsequently, a barrier metal layer 42 of TiN or WN (tungsten nitride) is formed all over the interlayer insulating film 11. Then a high-temperature RTA process is applied at 800 to 1000° C. for about 30 to 60 seconds in an atmosphere of nitrogen to completely silicidize TiSi or CoSi into TiSi$_2$ (titanium silicide) or CoSi$_2$ (cobalt silicide), thus forming a silicide film 41 only on the polysilicon plugs 29.

Figures 12A, 12B:
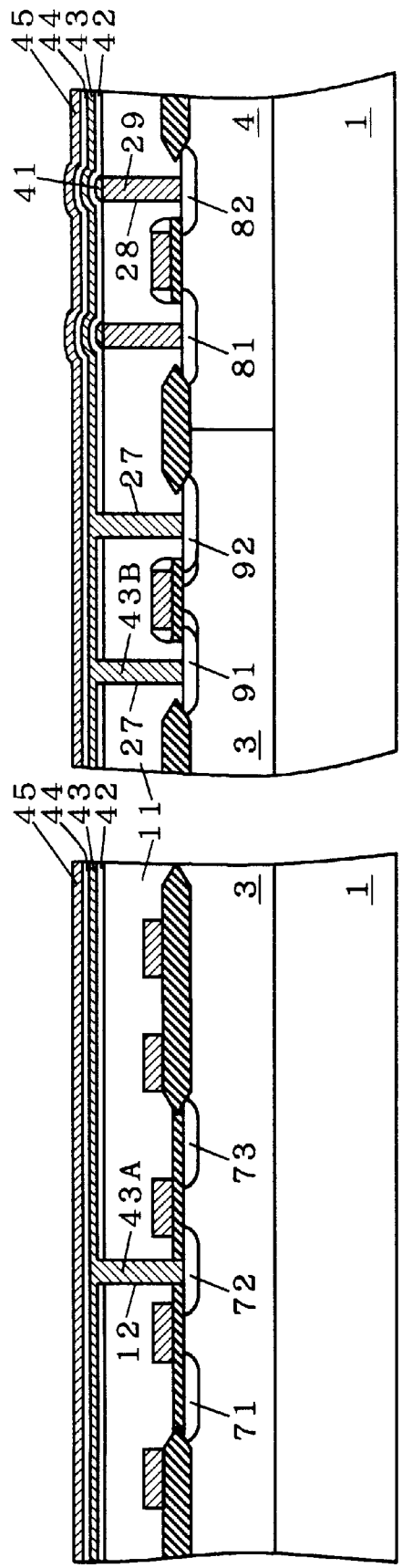

Next, as shown in FIGS. 12A and 12B, a bit line contact hole 12 reaching the N-type source/drain region 72 through the barrier metal layer 42 and the interlayer insulating film 11 is formed by an anisotropic etching like RIE in the memory cell part, and bit line contact holes 27 (first contact holes) reaching the N$^+$-type source/drain regions 91 and 92 (first semiconductor layer) are formed in the peripheral circuit part.

Subsequently, when a polysilicon layer 43, containing N-type impurities, is formed all over the barrier metal layer 42, it is also buried in the bit line contact holes 12 and 27 to form buried layers 43A and 43B (second buried layers).

Next, a barrier metal layer 44 of TiN or WN is formed all over the polysilicon layer 43 and then a metal layer 45 of a refractory metal such as W is formed all over the surface of the barrier metal layer 44.

The barrier metal layer 44 of TiN or WN is a layer for preventing silicide reaction between the refractory metal layer 45 made of W or the like and the polysilicon layer 43 that contains N-type impurities.

Figure 13B:
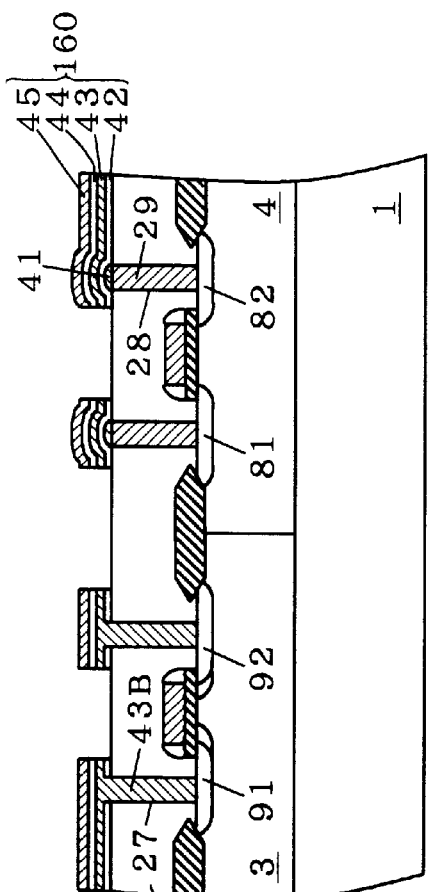
Figure 13A:
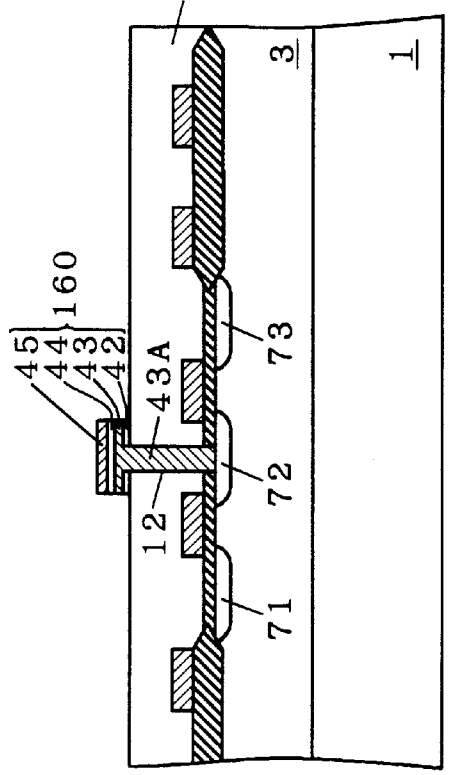

Next, in the process step shown in FIGS. 13A and 13B, the multi-layered film including the metal layer 45, barrier metal layer 44, polysilicon layer 43 and barrier metal layer 42 is patterned by photolithography and etching to form poly-metal bit lines 160 (multi-layer wiring layer) which are electrically connected to the buried layers 43A and 43B and the polysilicon plugs 29.

Although the poly-metal bit lines 160 in the peripheral circuit part do not always function only as bit lines, they are so named because they are formed in the same process step as the bit lines in the memory cell part. Also, the bit line contact holes 27 and 28 are so named because they are connected to the poly-metal bit lines 160, though they are not always connected to bit lines.

Although not shown in FIGS. 11B, 12B and 13B, a TG (Transfer Gate) wiring is formed in the peripheral circuit part in the same fabrication process as the word lines 61 (i.e., the gate electrodes 6), for example. Since the TG wiring is formed in almost the same layer as the gate electrodes 6, it may be electrically connected with the poly-metal bit lines 160 by using the bit line contact holes 27 and 28.

For example, in the process step shown in FIG. 12B, a bit line contact hole (almost the same as the bit line contact holes 27) reaching the TG wiring through the barrier metal layer 42 and the interlayer insulating film 11 may be formed at the same time when forming the bit line contact holes 27, and then the buried layer 43B is formed also in the bit line contact hole reaching the TG wiring at the same time when the buried layers 43B are formed in the bit line contact holes 27, so as to electrically connect the TG wiring and the poly-metal bit lines 160.

Next, in the process step shown in FIGS. 14A and 14B, an oxide film is formed all over the surface of the interlayer insulating film 11 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 11 and 17 to reach the N-type source/drain regions 71 and 73 in the memory cell part at least.

Next, when a conductor layer for the formation of storage nodes is formed all over the interlayer insulating film 17 with N$^+$ polysilicon into which N-type impurities are introduced to a high concentration, for example, the conductor layer for the formation of storage nodes is also buried in the storage node contact holes 18 to form buried layers 31.

A thick insulating film is then formed all over the surface and then the conductor layer for the formation of storage nodes and the thick insulating film are removed through a process of photolithography and etching, leaving bottom films 19 forming the bottom of the storage nodes and the thick insulating film on the bottom films 19. Now the thick insulating film on the bottom films 19 is called insulating films 26 for the formation of cylindrical capacitors.

Figure 15A:
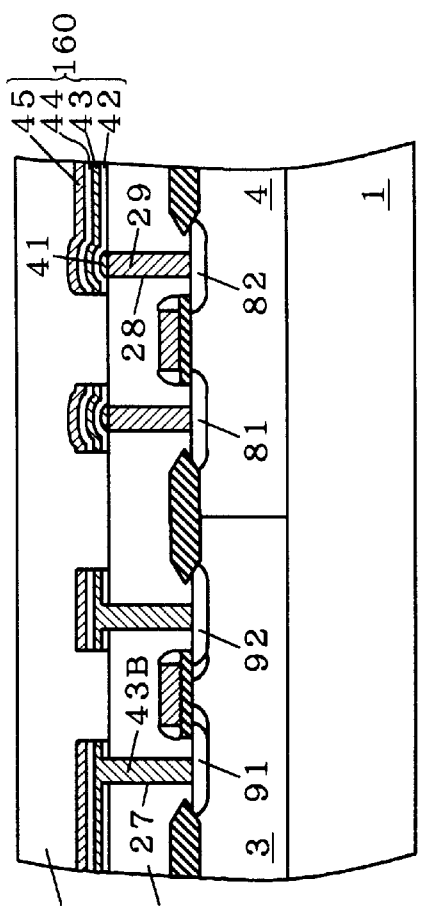
Figure 15B:
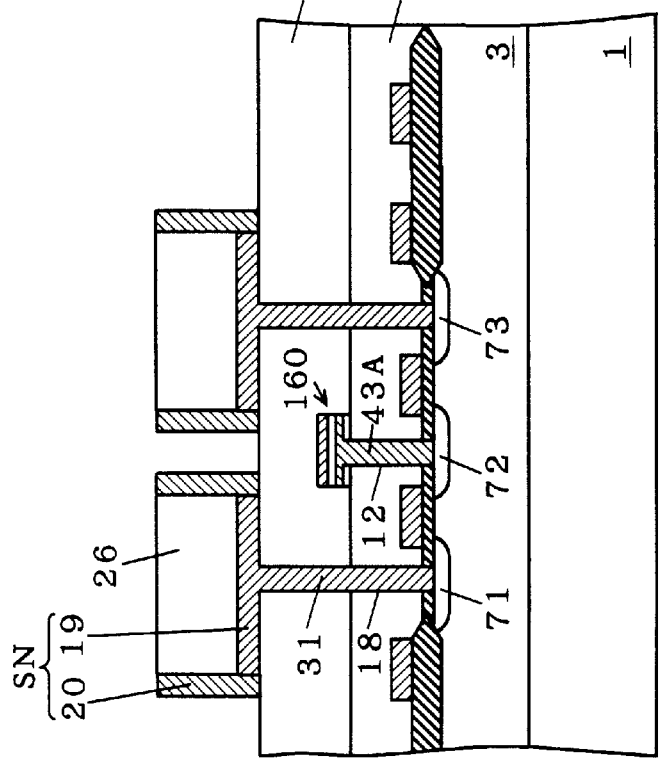

Next, in the process step shown in FIGS. 15A and 15B, a conductor layer for the formation of storage nodes is formed again all over the surface and is selectively removed by etch back, leaving the conductor layer for storage node formation only around the bottom films 19 and the insulating films 26 for cylindrical capacitor formation. The remaining parts of the conductor layer for storage node formation serve as side films 20 forming the side walls of the storage nodes. The bottom films 19 and the side films 20 form storage nodes SN.

Figure 16B:
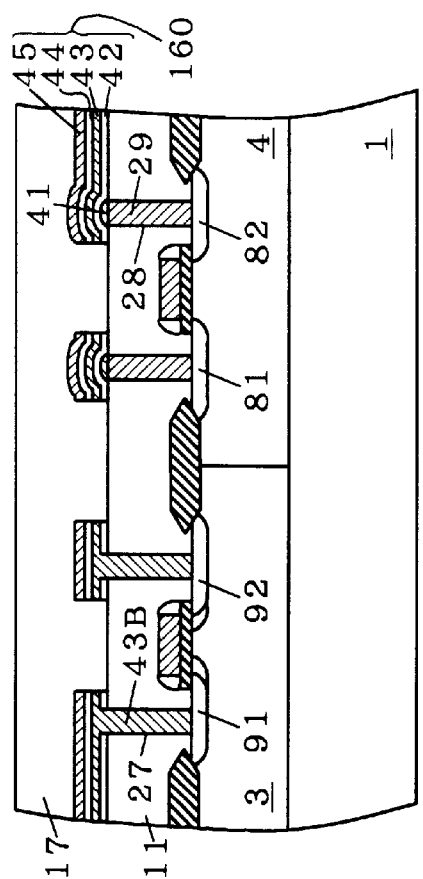
Figure 16A:
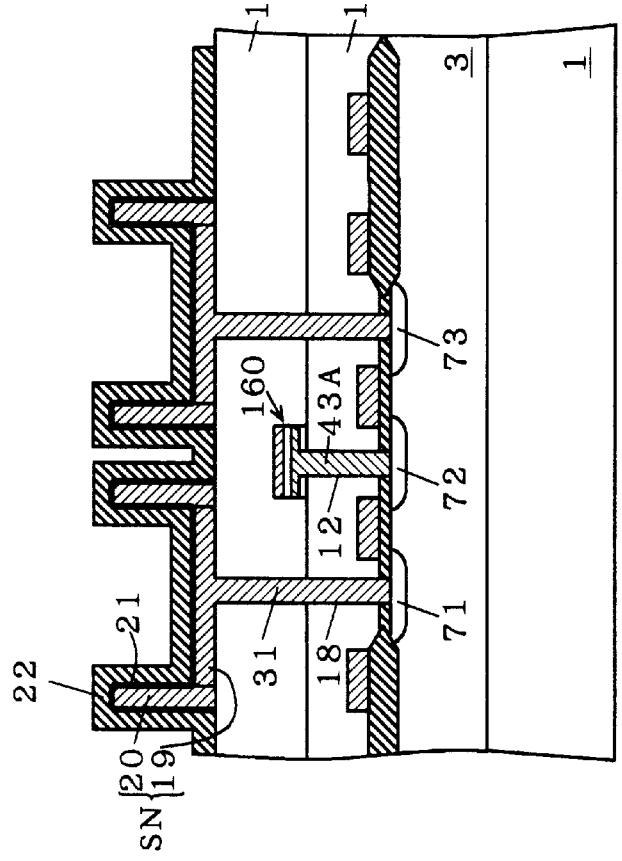

Next, only the insulating films 26 for cylindrical capacitor formation are removed and then a capacitor gate insulating film 21 is formed on the surface of the bottom films 19 and the side films 20 in the process step shown in FIGS. 16A and 16B. A conductive film for the formation of cell plate is then formed all over the surface and the conductive film for cell plate formation is left only in the memory cell part through a process of photolithography and etching. The remaining conductive film for cell plate formation forms a cell plate electrode 22.

Next, in the process step shown in FIGS. 17A and 17B, an oxide film is formed all over the surface and an interlayer insulating film 23 is formed by planarization. The interlayer insulating film 23 is called an interlayer insulating film underlying aluminum wiring so that it can be distinguished from other interlayer insulating films.

Next, an aluminum wiring contact hole 24A is formed to reach the cell plate electrode 22 in the memory cell part and aluminum wiring contact holes 24B are formed in the peripheral circuit part through the interlayer insulating films 23 and 17 to reach the poly-metal bit lines 160 electrically connected to the N$^+$-type source/drain region 92 and the P$^+$-type source/drain region 81.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then through a process of photolithography and etching, an aluminum wiring 25 is formed on the interlayer insulating film 23 in the memory cell part and the peripheral circuit part to obtain a DRAM 100A having cylindrical capacitor cells.

Although not shown in FIGS. 13B, 14B, 15B, 16B and 17B, a BL (Bit Line) wiring is formed in the same fabrication process as the poly-metal bit lines 160 in the peripheral circuit part, for example. Since it is formed in almost the same layer as the poly-metal bit lines 160, the BL wiring and the aluminum wiring 25 may be electrically connected by using the aluminum wiring contact holes 24B.

Figure 18:
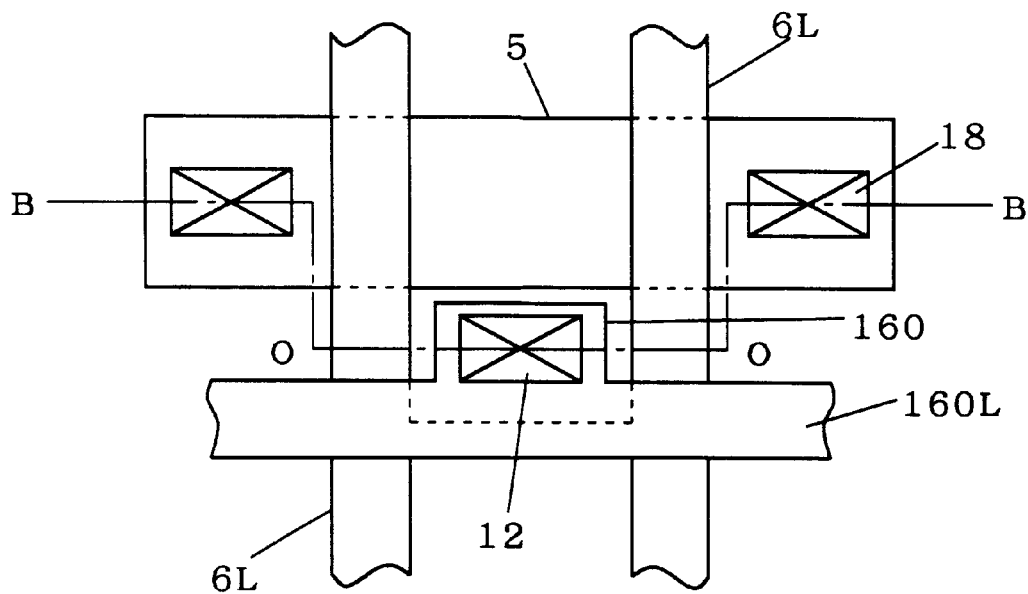
FIG. 18 is a partial plane view showing the structure of the semiconductor device of the first preferred embodiment of the present invention.

Now FIG. 18 shows the plane view taken along the line AA in FIG. 17A. In FIG. 18, the invisible wirings, covered by the interlayer insulating film, are also shown by solid lines.

In FIG. 18, the poly-metal bit line 160 is formed integrally with the BL wiring 160L to cover the bit line contact hole 12. The gate electrode 6 is formed integrally with the TG wiring 6L. The section taken along the line B00B in FIG. 18 shows the part below the line AA in FIG. 17A.

<A-2. Characteristic Functions and Effects>

As has been described above, according to the first preferred embodiment of the present invention, as has been described referring to FIGS. 12A and 12B, when the polysilicon layer 43 which contains N-type impurities is formed all over the surface of the barrier metal layer 42, it is also buried in the bit line contact hole 12 in the memory cell part and the bit line contact holes 27 in the peripheral circuit part to form the buried layers 43A and 43B. This eliminates the necessity of the CMP process which has been required to bury the polysilicon plugs 13 in the bit line contact holes 12 and 27 in the DRAM 100 having the dual polysilicon plug structure before improved (FIGS. 10A and 10B), which enables fabrication cost reduction.

The silicide film 41 of $TiSi_2, CoSi_2$, or the like, is formed on the top ends of the polysilicon plugs 29 containing P-type impurities, and the barrier metal layer 42 of TiN, WN, or the like, is formed thereon, and then the polysilicon layer 43 containing N-type impurities is formed further thereon. Therefore the polysilicon plugs 29 and the polysilicon layer 43 do not get into contact, thereby preventing mutual diffusion of P-type impurities and N-type impurities.

Further, the formation of the silicide film 41 on the top ends of the polysilicon plugs 29 reduces the contact resistance, as compared with the case in which the barrier metal layer 42 of TiN, WN, or the like, and the polysilicon plugs 29 come into direct contact.

<A-3. Modifications>

While a DRAM having a memory cell part and a peripheral circuit part has been described above as an example of a semiconductor device having dual polysilicon plug structure and manufacturing method thereof in which, in the peripheral circuit part, two kinds of semiconductor layers of different conductivity types formed in a silicon substrate and a conductor layer formed above the semiconductor layers with an interlayer insulating film interposed therebetween are electrically connected through two kinds of polysilicon plugs which contain impurities of the same conductivity types as the two kinds of semiconductor layers, applications of the dual polysilicon plug structure are not limited to DRAMs. It can be applied to any semiconductor devices having a plurality of circuit parts with different structures and in which layers (semiconductor layer, conductor layer) provided above and below an interlayer insulating film are electrically connected through plugs buried in the interlayer insulating film in the circuit parts.

<B. Second Preferred Embodiment>

Generally, with highly-integrated and large-capacity DRAMs, high resolution is required in photolithography, and therefore the focus margin is reduced as the trade off.

Accordingly, if the difference in level at the pattern step becomes larger over the focus margin as the degree of integration increases and the capacity becomes larger, it is then very difficult to form wirings by photolithography. Especially, with stacked capacitor cells which are formed by stacking capacitors on a silicon substrate, the difference in level at the pattern step is noticeable, and it is therefore essential to reduce the step height. The interlayer insulating film 11, the interlayer insulating film 17 and the interlayer insulating film 23 therefore undergo planarization as shown in FIGS. 10A, 10B, 17A and 17B, for example.

However, such planarization process may cause the thickness of the interlayer films from the aluminum wiring to the silicon substrate to become too thick, and then the formation of contact holes for directly connecting the aluminum wiring and the silicon substrate, or the aluminum wiring and the TG wiring, may become quite difficult. This problem can be solved by buried plug structures including the dual polysilicon plug structure, or the structure in which layers (semiconductor layer, conductor layer) provided above and below an interlayer insulating film are electrically connected through plugs buried in the interlayer insulating film in a plurality of circuit parts with different structures.

In the buried plug structures like the dual polysilicon plug structure, however, when electrically connecting aluminum wiring and a plug, for example, it was necessary to provide a bit line pad having larger dimension than the plug, considering alignment margin for the aluminum wiring. The same is true when electrically connecting aluminum wiring and TG wiring.

Thus making electric connection between aluminum wiring and silicon substrate and electric connection between the aluminum wiring and TG wiring through a bit line pad means that the size reduction of bit line interval is limited by the bit line pad.

Hence, as a second preferred embodiment of the present invention, a structure and manufacturing method for enabling size reduction of bit line interval will be described in a semiconductor device having the dual polysilicon plug structure.

<B-1. Manufacturing Process>

Figure 19A:
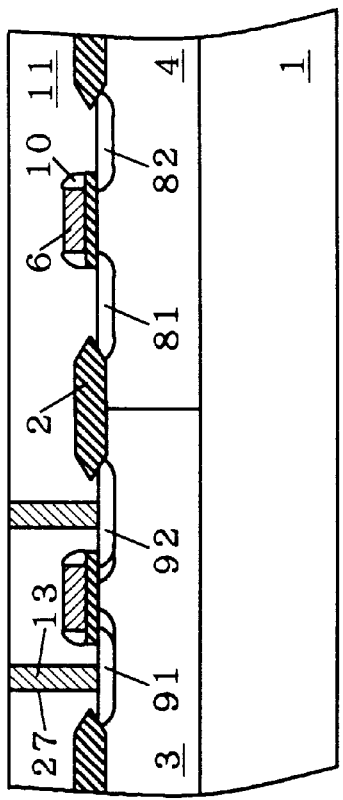
Figure 19B:
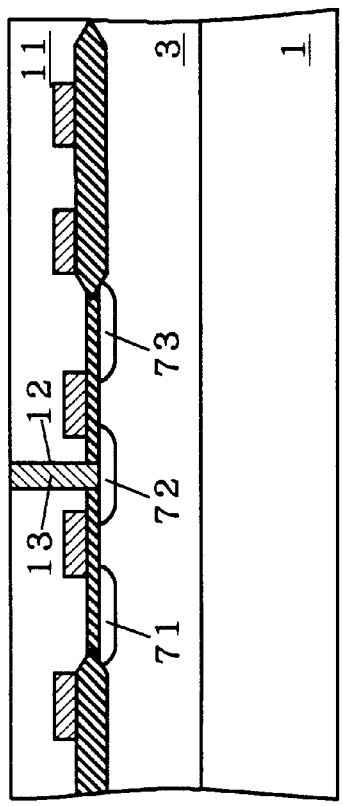
Figure 29A:
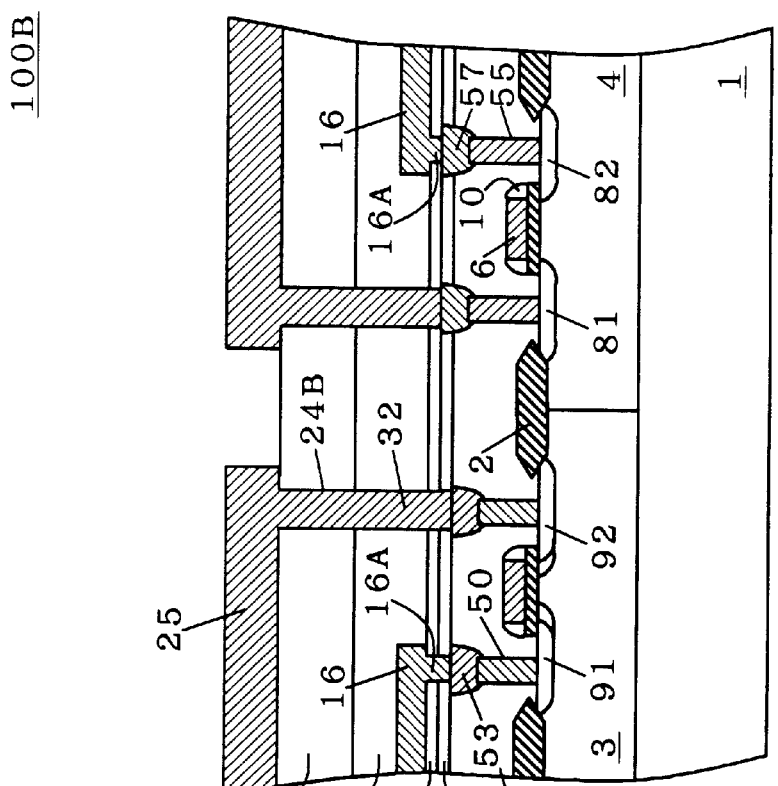
Figure 29B:
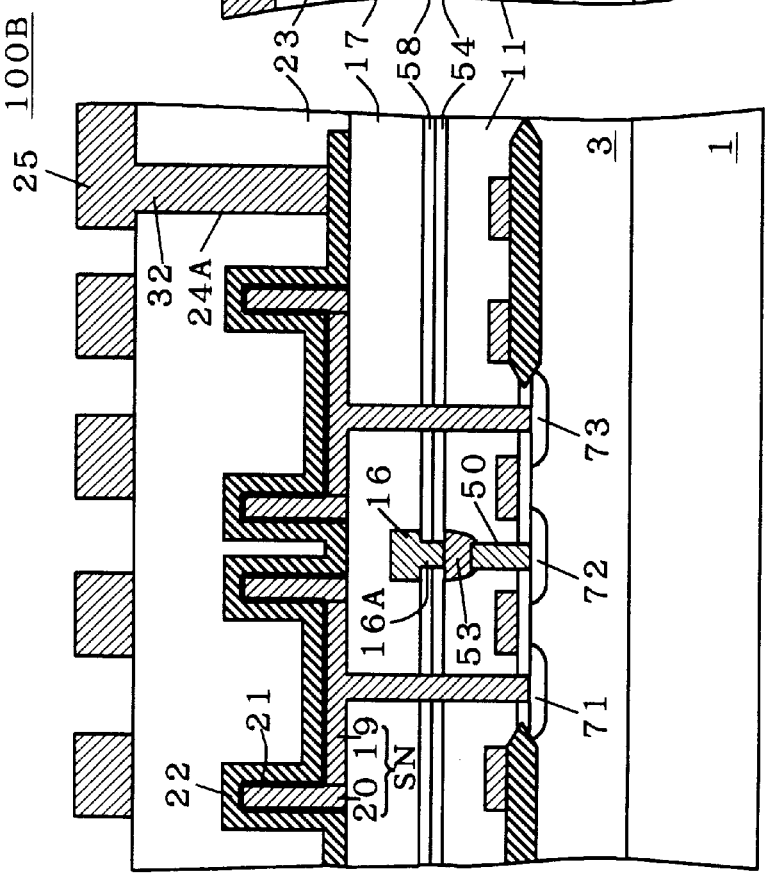

As a second preferred embodiment according to the present invention, the structure and manufacturing process of a DRAM 100B having cylindrical capacitor cells will be described referring to FIGS. 19A to 29B. The process steps performed before obtaining the structure shown in FIGS. 19A and 19B are the same as those shown in FIGS. 1A to 3B described in the method for manufacturing the DRAM 100, which are therefore not described again. The structure of the DRAM 100B is shown in FIGS. 29A and 29B showing the final process step.

FIGS. 19A, 20A, 21A, 22A, 23A, 24A, 25A, 26A, 27A, 28A and 29A are partial sectional views showing the memory cell part (data holding part) of the DRAM 100B, and FIGS. 19B, 20B, 21B, 22B, 23B, 24B, 25B, 26B, 27B, 28B and 29B are partial sectional views showing the peripheral circuit part including sense amps, decoders, etc., formed around the memory cell part in the DRAM 100B.

As has been described referring to FIGS. 3A and 3B, the $P^+$-type source/drain regions 81 and 82 (second semiconductor layer) are formed in the N-type well region 4, and then, as shown in FIGS. 19A and 19B, an oxide film is formed all over the surface and the interlayer insulating film 11 (first interlayer insulating film) is formed by planarization. The interlayer insulating film 11 and interlayer insulating films 54, 58 shown later are called interlayer insulating films underlying bit lines so that they can be distinguished from other interlayer insulating films.

While the interlayer insulating film 11 and interlayer insulating films 54, 58, 17, and 23 shown later are insulating films formed with the same material simultaneously in the memory cell part and the peripheral circuit part, the parts formed on the P-type well region 3 are called a first part and the parts formed on the N-type well region 4 are called a second part for distinction between the portions formed in the peripheral circuit part.

Next, as shown in FIGS. 19A and 19B, a bit line contact hole 12 reaching the N-type source/drain region 72 through the interlayer insulating film 11 is formed by an anisotropic etching like RIE in the memory cell part, and bit line contact holes 27 (first contact holes) reaching the $N^+$-type source/drain regions 91 and 92 (first semiconductor layer) are formed in the peripheral circuit part.

Next, a polysilicon layer, containing N-type impurities, is formed all over the surface of the interlayer insulating film 11 and the polysilicon layer is then removed by CMP except in the bit line contact holes 12 and 27 to form polysilicon plugs 13 (first buried layer) in the bit line contact holes 12 and 27.

Figure 20B:
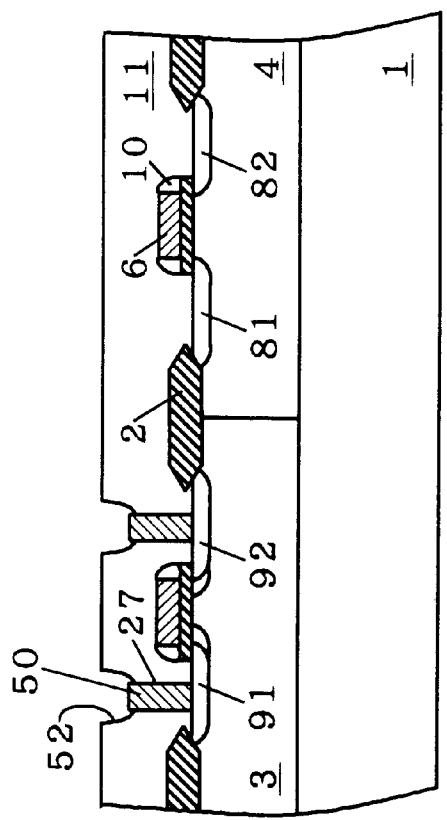
Figure 20A:
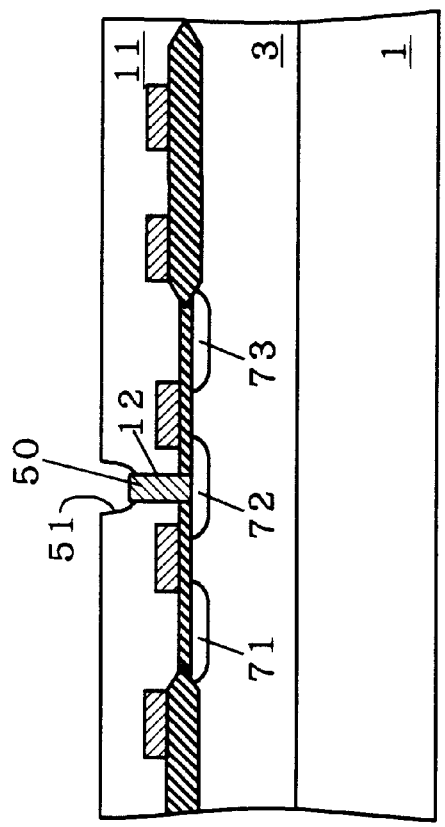

As shown in FIGS. 20A and 20B, the interlayer insulating film 11 is etched back all over the surface under etching conditions in which the etching selectivity for the polysilicon plugs 13 with respect to the interlayer insulating film 11 is 10, for example, and the polysilicon plugs 13 are thus recessed to a given depth in the bit line contact holes 12 and 27 to form recessed polysilicon plugs 50 (first recessed polysilicon plugs). Subsequently, the interlayer insulating film 11 is wet-etched to enlarge the opening diameter of the bit line contact holes 12 and 27 to a given size to form enlarged contact parts 51 and 52 (first enlarged contact parts). The depth of the enlarged contact parts 51 and 52 is such that they reach the recessed polysilicon plugs 50, and their contour in section is a curved shape. The conditions for determining the etching selectivity and recessed depth in this process step will be fully described later referring to FIGS. 30 to 32, and the conditions for determining the opening diameter of the enlarged contact parts will be fully described later referring to FIGS. 33 to 36.

Figure 21A:
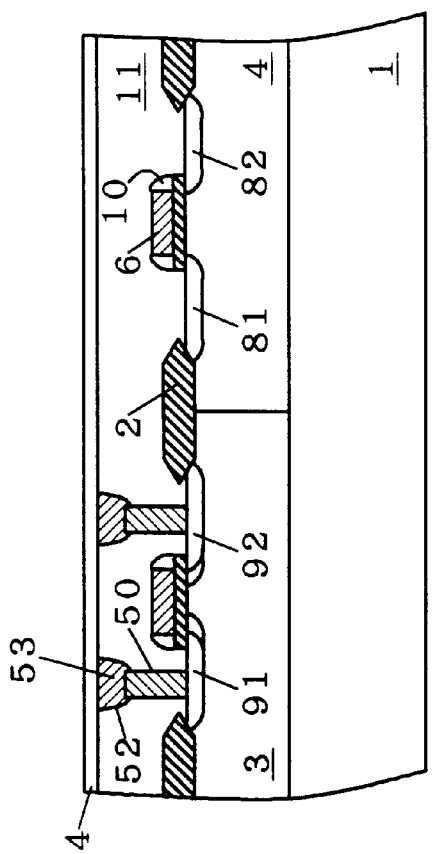
Figure 21B:
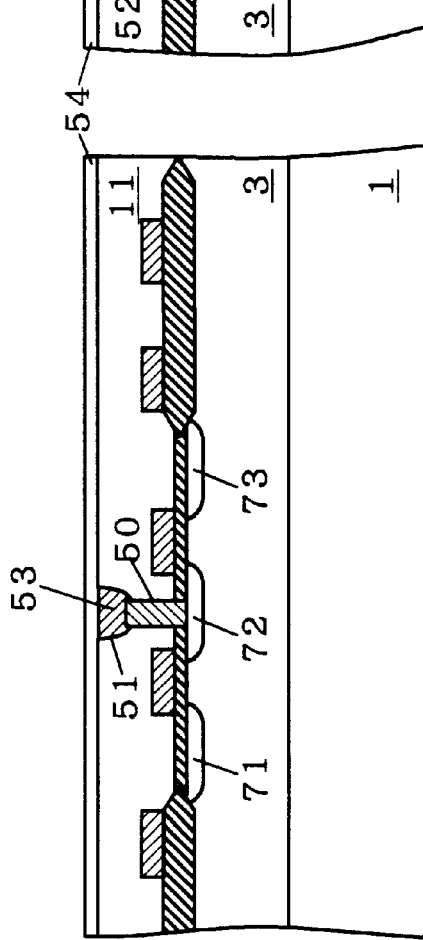

Next, as shown in the process step shown in FIGS. 21A and 21B, a polysilicon layer, containing N-type impurities, is formed all over the interlayer insulating film 11, and the polysilicon layer is then removed by CMP except in the enlarged contact parts 51 and 52, to form enlarged polysilicon plugs 53 (first polysilicon plugs) in the enlarged contact parts 51 and 52.

Then an oxide film is formed all over the interlayer insulating film 11 and an interlayer insulating film 54 (second interlayer insulating film) is formed by planarization.

Figure 22B:
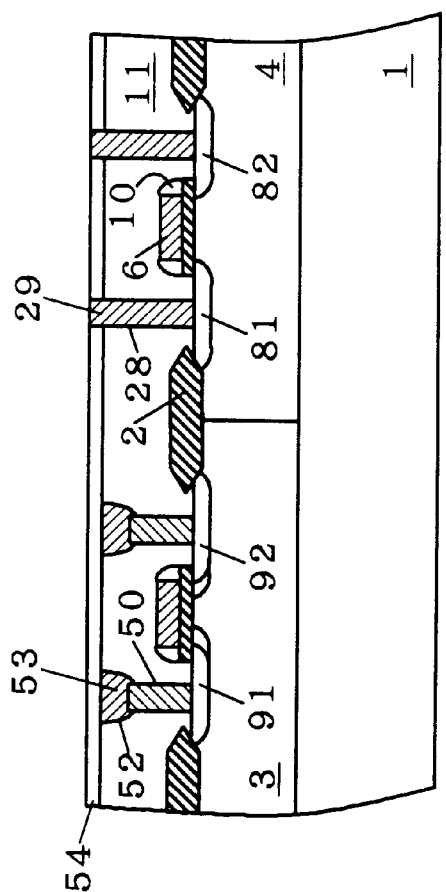
Figure 22A:
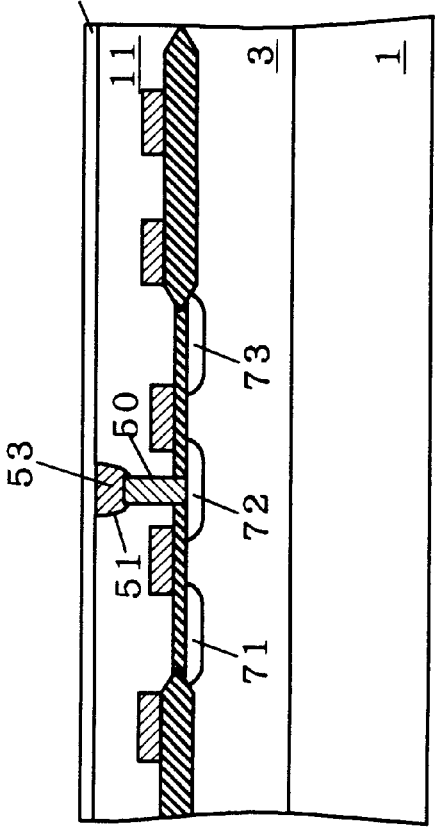

Next, in the process step shown in FIGS. 22A and 22B, bit line contact holes 28 (second contact holes) are formed by an anisotropic etching like RIE through the interlayer insulating films 54 and 11 to reach the $P^+$-type source/drain regions 81 and 82 in the peripheral circuit part.

Subsequently, a polysilicon layer, containing P-type impurities, is formed all over the interlayer insulating film 54 and the polysilicon layer is then removed by CMP except in the bit line contact holes 28, to form polysilicon plugs 29 (second buried layers) in the bit line contact holes 28.

Figures 23A, 23B:
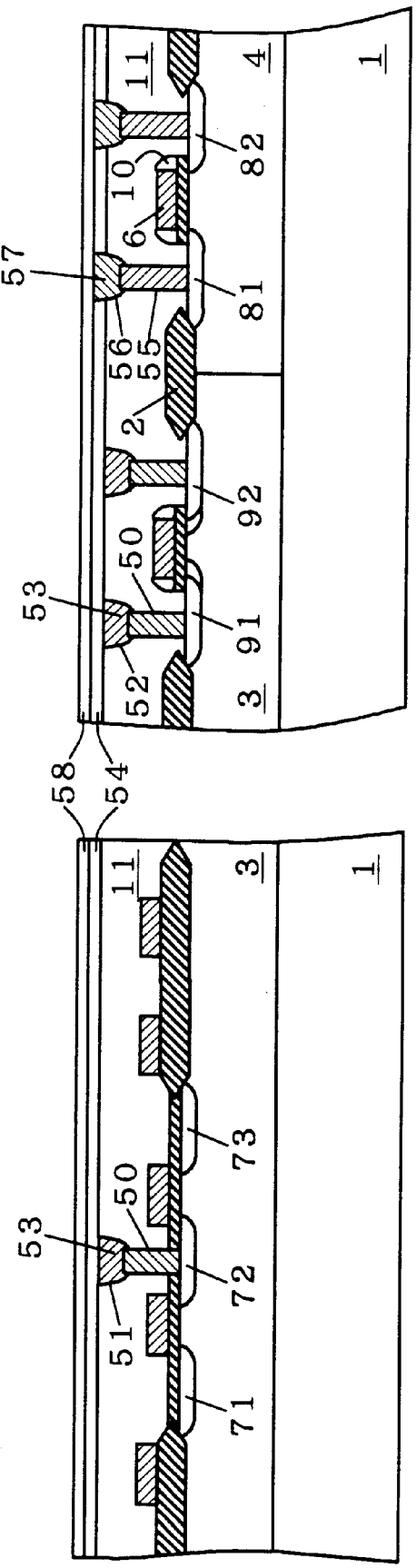

As shown in FIGS. 23A and 23B, the interlayer insulating films 54 and 11 are etched back all over the surface under etching conditions in which the etching selectivity for the polysilicon plugs 29 with respect to the interlayer insulating films 54 and 11 is 10, for example, and the polysilicon plugs 29 are thus recessed to a given depth in the bit line contact holes 28 to form recessed polysilicon plugs 55 (second recessed polysilicon plugs). Subsequently, the interlayer insulating films 54 and 11 are wet-etched to enlarge the opening diameter of the bit line contact holes 28 to a given size to form enlarged contact parts 56 (second enlarged contact parts). The depth of the enlarged contact parts 56 is such that they reach the recessed polysilicon plugs 55, and their contour in section is a curved shape.

Next, a polysilicon layer, containing P-type impurities, is formed all over the interlayer insulating film 54, and the polysilicon layer is then removed by CMP except in the enlarged contact parts 56, to form enlarged polysilicon plugs 57 (second polysilicon plugs) in the enlarged contact parts 56. Then an oxide film is formed all over the interlayer insulating film 54 and an interlayer insulating film 58 (third interlayer insulating film) is formed by planarization.

Next, in the process step shown in FIGS. 24A and 24B, bit line through holes 59 are formed by anisotropic etching such as RIE to reach the enlarged polysilicon plug 53 in the memory cell part, the enlarged polysilicon plug 53 electrically connected to the $N^+$-type source/drain region 91 in the peripheral circuit part, and the enlarged polysilicon plug 57 electrically connected to the $P^+$-type source/drain region 82.

Figures 25A, 25B:
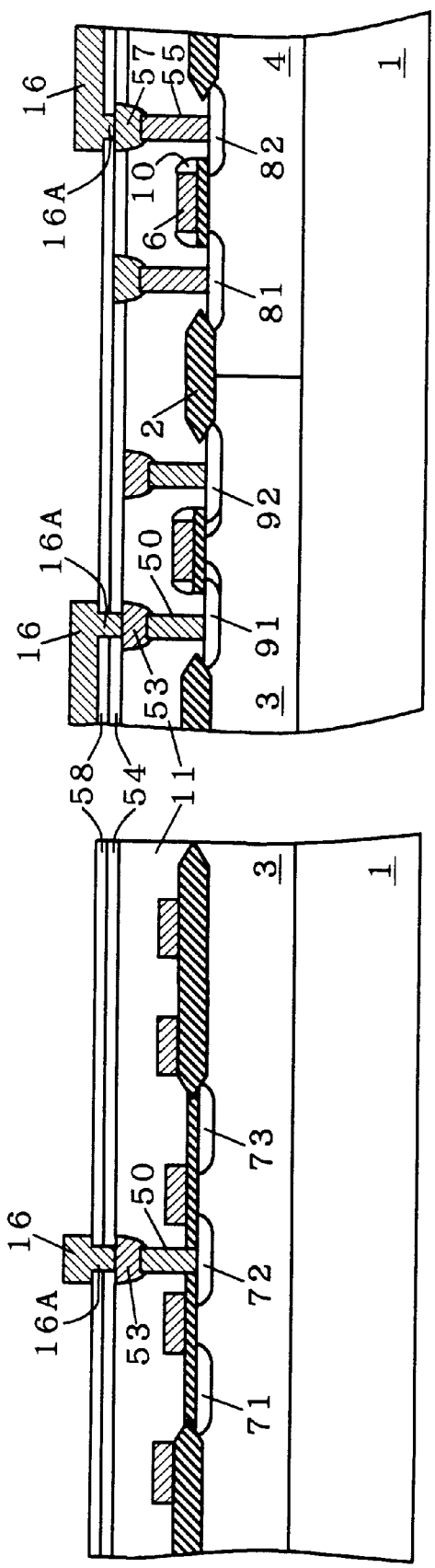

Subsequently, in the process step shown in FIGS. 25A and 25B, a metal layer of TiN, W, or the like, or a multi-layered film thereof, is formed all over the interlayer insulating film 58, and the metal layer (or the multi-layered metal film) is then buried in the bit line through holes 59 to form buried layers 16A. The metal layer (or the multilayered metal film) is then patterned by photolithography and etching to form metal bit lines 16.

Although the metal bit lines 16 in the peripheral circuit part do not always function only as bit lines, they are so named because they are formed in the same process as the bit lines in the memory cell part. Also, the bit line through holes 59 are so named because they are connected to the metal bit lines 16, though they are not always connected to bit lines.

Next, in the process step shown in FIGS. 26A and 26B, an oxide film is formed all over the surface of the interlayer insulating film 58 and an interlayer insulating film 17 is formed by planarization. The interlayer insulating film 17 is called an interlayer insulating film underlying storage nodes so that it can be distinguished from other interlayer insulating films.

Next, storage node contact holes 18 are formed through the interlayer insulating films 17, 58, 54, and 11 to reach the N-type source/drain regions 71 and 73 in the memory cell part at least.

Next, when a conductor layer for the formation of storage nodes is formed all over the surface of the interlayer insulating film 17 with $N^+$ polysilicon into which N-type impurities are introduced at a high concentration, for example, the conductor layer for the formation of storage nodes is also buried in the storage node contact holes 18 to form buried layers 31.

Then a thick insulating film is formed all over the surface and then the conductor layer for the formation of storage nodes and the thick insulating film are removed through a process of photolithography and etching, leaving the bottom films 19 forming the bottom of the storage nodes and the thick insulating film on the bottom films 19. Now the thick insulating film on the bottom films 19 is called insulating films 26 for the formation of cylindrical capacitors.

Figures 27A, 27B:
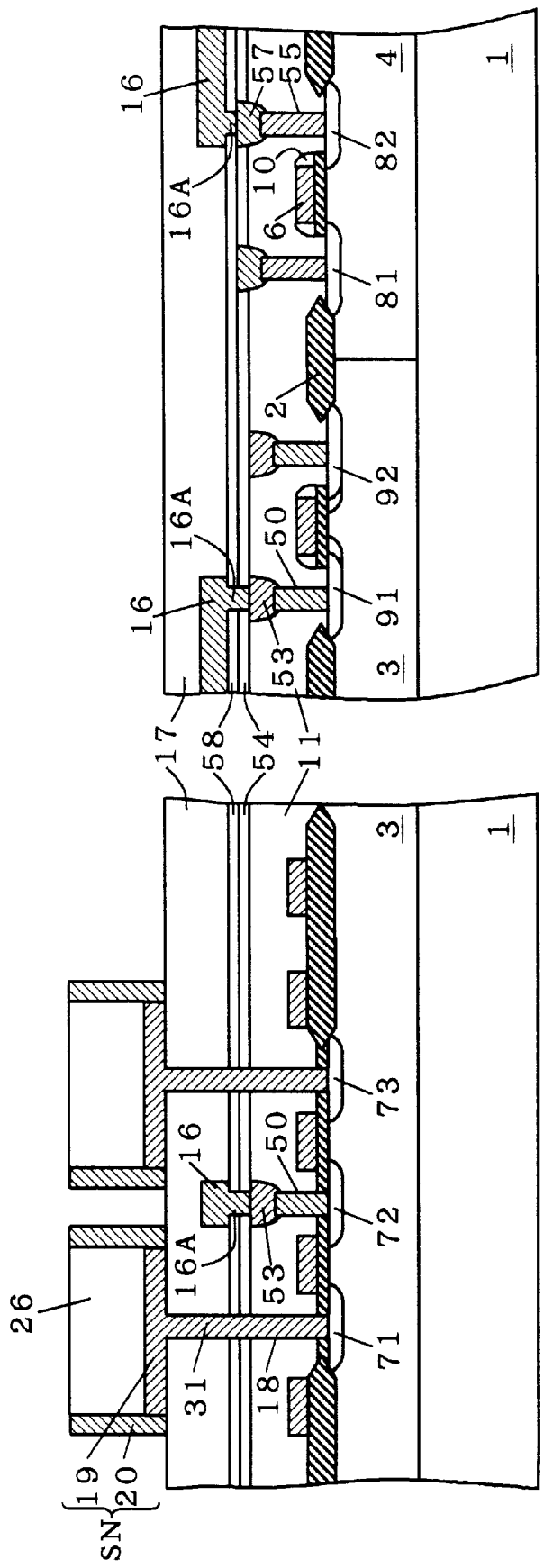

Next, in the process step shown in FIGS. 27A and 27B, a conductor layer for the formation of storage nodes is formed again all over the surface and is selectively removed by etch back, and it is left only around the bottom films 19 and the insulating films for the formation of cylindrical capacitors, 26. The remaining parts of the conductor layer for the formation of storage nodes form side films 20 forming the side walls of the storage nodes. The bottom films 19 and the side films 20 form storage nodes SN.

Next, only the insulating films 26 for cylindrical capacitor formation are removed and then a capacitor gate insulating film 21 is formed on the surface of the bottom films 19 and the side films 20 in the process step shown in FIGS. 28A and 28B. Then a conductive film for the formation of cell plate is formed all over the surface and is left only in the memory cell part through process of photolithography and etching. The remaining conductive film for cell plate formation forms a cell plate electrode 22.

Next, in the process step shown in FIGS. 29A and 29B, an oxide film is formed all over the surface and an interlayer insulating film 23 is formed by planarization. The interlayer insulating film 23 is called an interlayer insulating film underlying aluminum wiring to distinguish it from other interlayer insulating films.

Next, an aluminum wiring contact hole 24A reaching the cell plate electrode 22 is formed in the memory cell part and aluminum wiring contact holes 24B are formed in the peripheral circuit part through the interlayer insulating films 23, 17, 58, 54 to reach the enlarged polysilicon plugs 53 and 57 electrically connected to the N$^+$-type source/drain region 92 and the P$^+$-type source/drain region 81.

Next, when a conductor layer for the formation of aluminum wiring is formed all over the surface of the interlayer insulating film 23, the conductor layer for the formation of aluminum wiring is also buried in the aluminum wiring contact holes 24A and 24B. At this time, buried layers 32 are formed in the aluminum wiring contact holes 24A and 24B. Although a conductor layer for the formation of aluminum wiring is buried in the aluminum wiring contact holes 24A and 24B in this example, it is not limited to aluminum but may be any conductor layer of metal or the like.

Then, through a process of photolithography and etching, aluminum wiring 25 is formed on the interlayer insulating film 23 in the memory cell part and the peripheral circuit part to obtain a DRAM 100B having cylindrical capacitor cells.

<B-2. Condition for Formation of Recessed Polysilicon Plugs>

Figure 30:
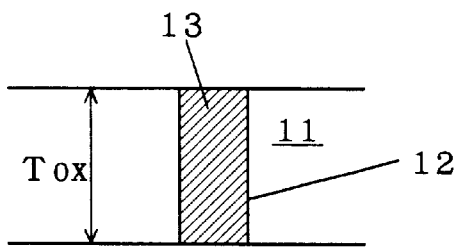
FIGS. 30 to 32 are diagrams used to describe conditions for the formation of a recessed polysilicon plug.
Figure 31:
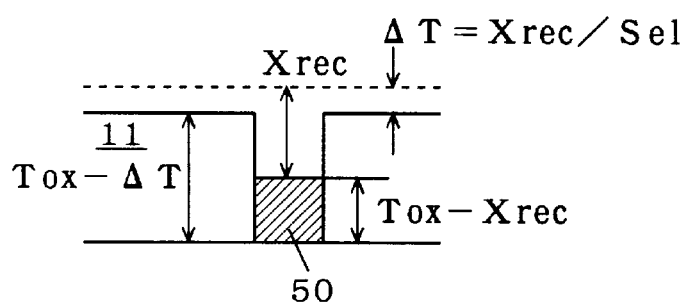
Figure 32:
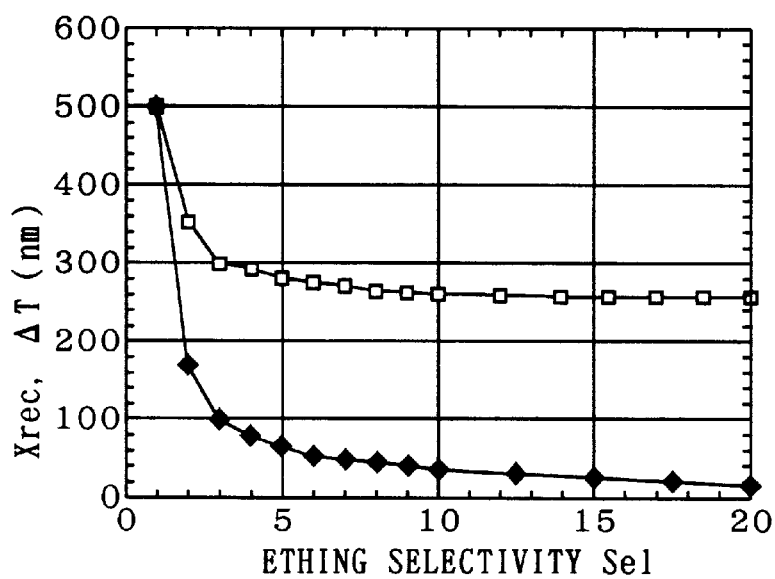

Now conditions for the formation of the recessed polysilicon plugs 50 and 55 described referring to FIGS. 20A, 20B, 23A and 23B will be further described referring to FIGS. 30 to 32. The description is made about the recessed polysilicon plug 50 as an example.

FIG. 30 shows the interlayer insulating film 11 before the recessing process and the polysilicon plug 13 buried in the bit line contact hole 12 passing through the interlayer insulating film 11. As shown in FIG. 30, the thickness of the interlayer insulating film 11 before the recessing process is taken as Tox.

FIG. 31 shows the interlayer insulating film 11 after the recessing process and the recessed polysilicon plug 50 in the bit line contact hole 12. In FIG. 31, the surface level of the interlayer insulating film 11 before the recessing process is shown by the broken line.

As shown in FIG. 31, the reduction in thickness of the interlayer insulating film 11 etched in the recessing process is taken as $\Delta T$, the thickness of the interlayer insulating film 11 after the recessing process is taken as Tox–$\Delta T$, the recessed quantity of the polysilicon plug 13 is taken as Xrec, and the height of the recessed polysilicon plug 50 is taken as Tox–Xrec. When the etching selectivity of the polysilicon plug 13 with respect to the interlayer insulating film 11 is taken as Sel, the reduction $\Delta T$ in the thickness of the interlayer insulating film 11 is given as $\Delta T$=Xrec/Sel.

Next, conditions for determining the etching selectivity and the recess depth will be described. In order to determine the etching selectivity and recess depth, it is necessary to consider the conditions for stably forming the recessed polysilicon plug 50 in the structural aspect (structural stability conditions) and the conditions for stably forming the recessed polysilicon plug 50 in the processing aspect (process stability conditions).

Specific indexes for the structural stability conditions include the value showing the position of the end surface of the recessed polysilicon plug 50 (the opposite side to the side in contact with the semiconductor silicon substrate) in the bit line contact hole 12 after the recessing process (which is called a "g-value"), for example. The g-value must be in the range of 0<g<1 to achieve structural stability of the recessed polysilicon plug 50. If the end surface of the recessed polysilicon plug 50 is at the midpoint in the bit line contact hole 12, then g=0.5.

The process stability conditions include the value obtained by comparing the etched quantity of the interlayer insulating film 11 between the case of the current selectivity Sel maintained and the case of the selectivity Sel increased by one (called an "f-value"), for example. The f-value must be in the range of 0<f<1 to achieve the processing stability. Now, f=0.1 means that the etched quantity of the interlayer insulating film 11 increases only 10% when the selectivity Sel is increased by one from the current selectivity Sel.

Next, the structural stability conditions can be numerically expressed with the quantities shown in FIGS. 30 and 31, the g-value, and the f-value as shown in the following equations (1) to (3), and the process stability conditions can be given as the following expression (4). For the selectivity Sel, Sel>1.

$$(Tox-Xrec)=g(Tox-Xrec/Sel)>0 \tag{1}$$

$$Xrec=(1-g)Tox/\{1-(g/Sel)\} \tag{2}$$

$$\Delta T=Xrec/Sel \tag{3}$$

$$Sel>(1+f\cdot g)/f \tag{4}$$

FIG. 32 shows a graph created on the basis of the equations (2) and (3). In FIG. 32, with the thickness of the interlayer insulating film 11 being 500 nm and g=0.5, the quantity of plug recess Xrec and the reduction $\Delta T$ in the thickness of the interlayer insulating film 11 are plotted with respect to the etching selectivity Sel changed from 1 to 20.

The etching selectivity Sel satisfying the process stability conditions is obtained from expression (4) as Sel=10.5 (in the case where f=0.1, g=0.5). The quantity of plug recess Xrec and the reduction $\Delta T$ in the thickness of the interlayer insulating film 11 in the case of Sel=10.5 are obtained from the graph in FIG. 32 as Xrec=263 nm, $\Delta T$=25 nm, and the final height of the recessed polysilicon plug 50 is about 238 nm.

It is seen from FIG. 32 that the selectivity dependencies of the quantity of plug recess Xrec and the reduction ΔT in the thickness of the interlayer insulating film 11 are both stable with the selectively at or above 5. Then it is seen that the selectivity should be set around 10 to process-stably form the stable structure in which the end surface of the recessed polysilicon plug 50 is located at the midpoint in the bit line contact hole 12. It can be said that the recessed polysilicon plug 50 is not too thick nor too thin and the structural stability conditions are satisfied when the g-value is 0.5.

Further, it is seen that when the g-value is in the range of 0<g<1, that is, whatever value the recessed quantity of the polysilicon plug 13 may be, setting the selectivity around 10 enables stable formation of the recessed polysilicon plug 50 in both of structural and processing aspects.

<B-3. Conditions for Determining Opening Diameter of Enlarged Contact Parts>

Conditions for the formation of the enlarged contact parts 51, 52, and 56 described referring to FIGS. 20A, 20B, 23A and 23B and functions and effects of the formation of the enlarged contact parts will now be described referring to FIGS. 33 to 36.

Figure 33:
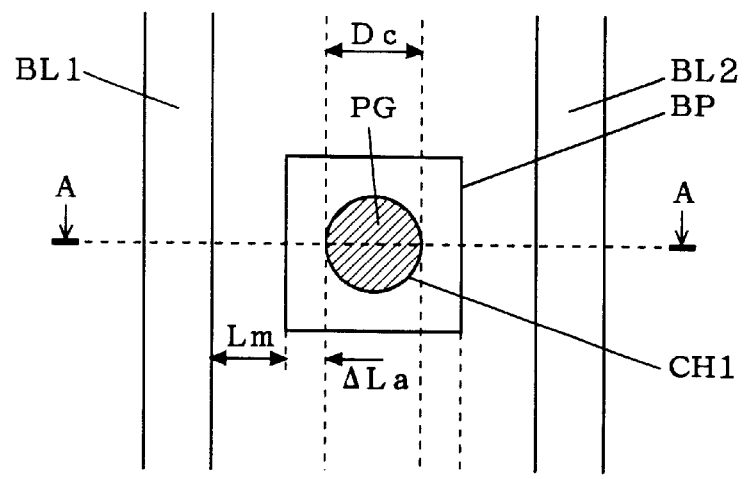
FIGS. 33 to 36 are diagrams used to describe functions and effects of the formation of an enlarged contact part.
Figure 34:
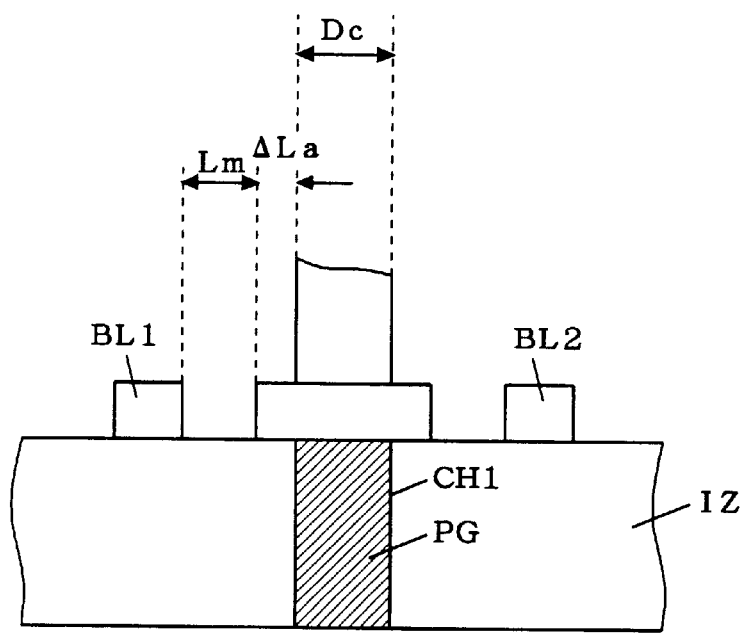

First, referring to FIGS. 33 and 34, a structure for connecting the aluminum wiring to a bit line pad will be described. FIG. 33 is a schematic diagram showing a contact hole CH1 formed between two parallel bit lines BL1 and BL2 and a bit line pad BP formed on the contact hole CH1. A polysilicon plug PG is buried in the contact hole CH1. FIG. 34 shows the sectional structure taken along the line AA in FIG. 33, which shows the structure in which the contact hole CH1 is formed in an interlayer insulating film IZ (the interlayer insulating film underlying bit lines). An aluminum wiring contact hole CH2 is formed in an interlayer insulating film, but the diagram does not show the interlayer insulating film.

As shown in FIGS. 33 and 34, when the diameter of the aluminum wiring contact hole CH2 is taken as Dc, the alignment accuracy for preventing the aluminum wiring contact hole CH2 from protruding Out of the bit line pad BP when it is directly connected to the bit line pad BP, i.e., to the bit line, is taken as ΔLa, the interval between the bit line pad BP and the bit line BL1 (or BL2) is taken as Lm, and the finishing accuracy of the bit line width and the aluminum wiring contact hole diameter is taken as ΔLcd, then the minimum interval between the bit lines BL1 and BL2 is given as Dc+2Lm+2 (ΔLa+ΔLcd). If Lm is smaller than bit line interval based on minimum design rules, the possibility that the bit line and bit line pad come into contact increases.

When the bit line interval based on minimum design rules is 0.16 μm, then Dc is 0.2 μm, Lm is 0.16 μm, ΔLa is 0.05 μm, and ΔLcd is 0.03 μm, and the minimum interval between the bit lines BL1 and BL2 is 0.68 μm.

Figure 35:
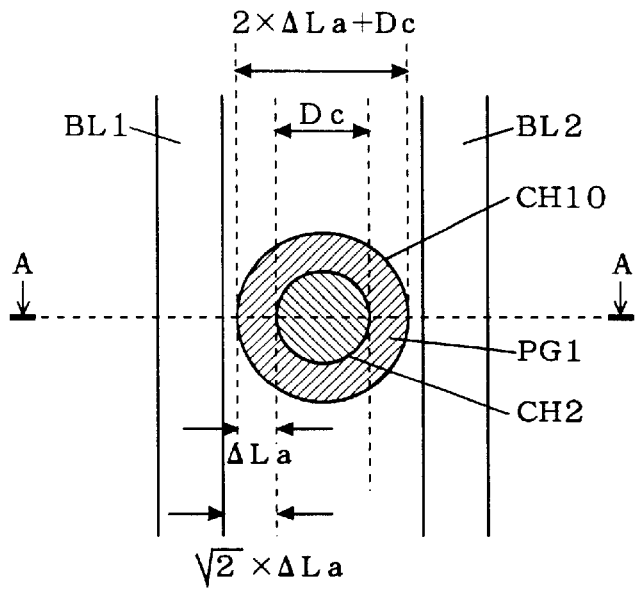
Figure 36:
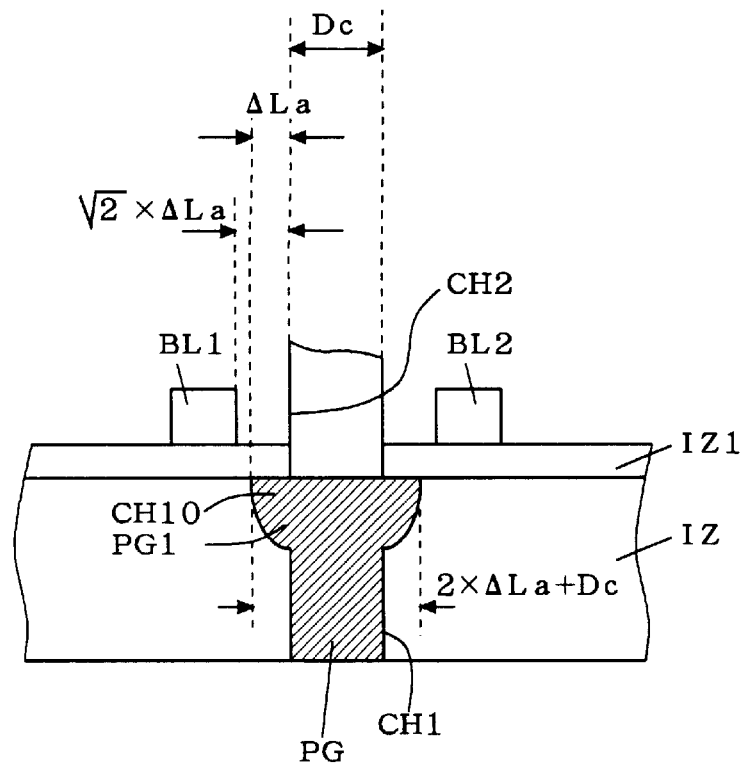
Figure 37B:
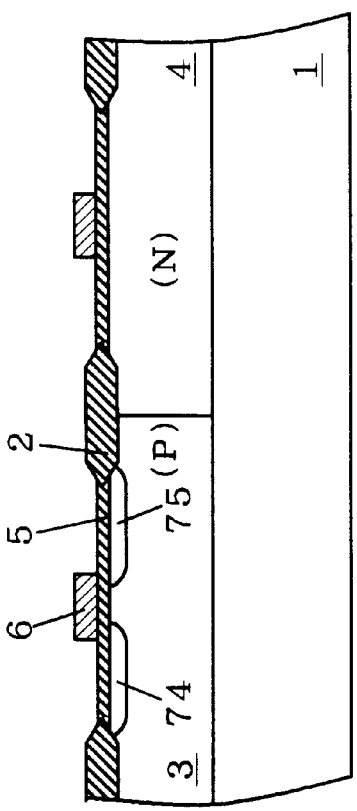
Figure 37A:
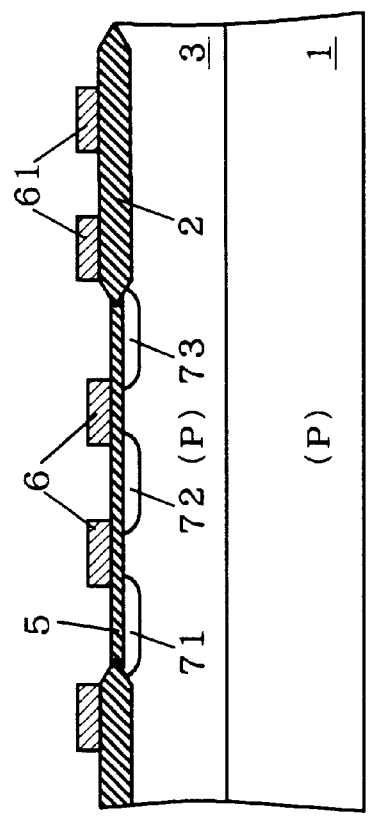
Figure 38B:
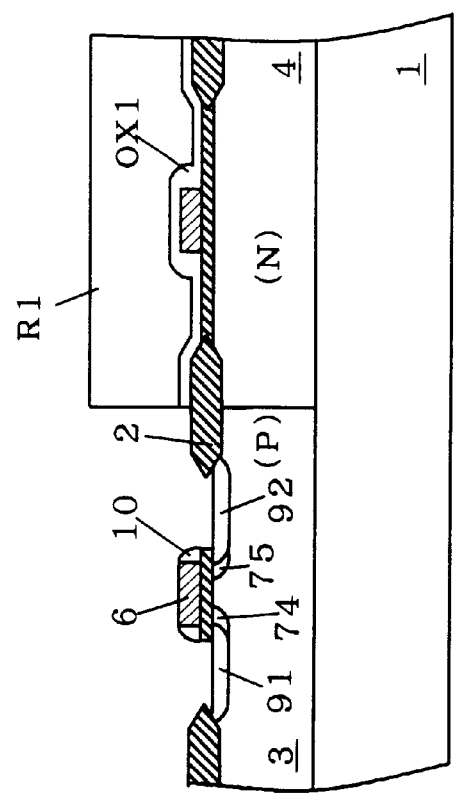
Figure 38A:
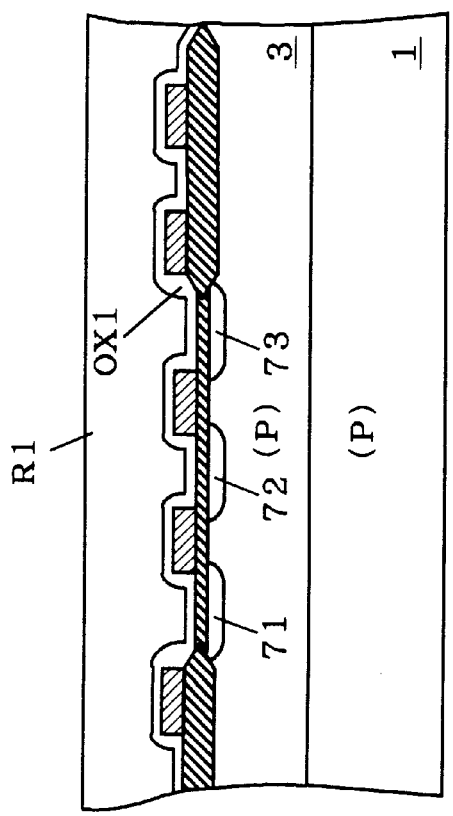
Figure 39B:
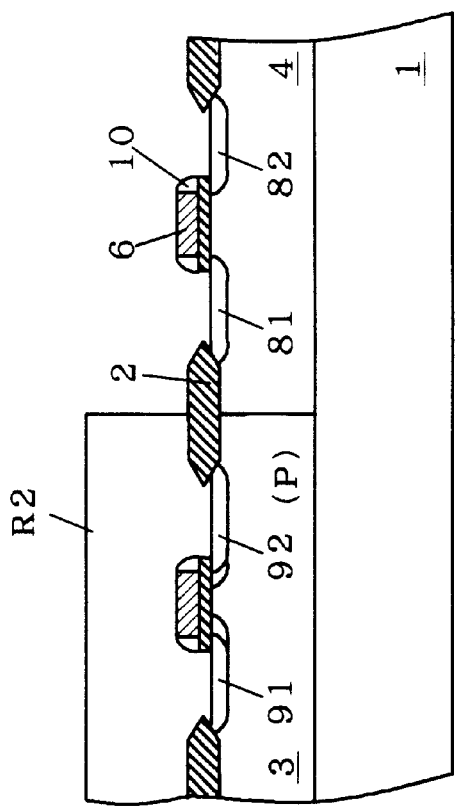
Figure 39A:
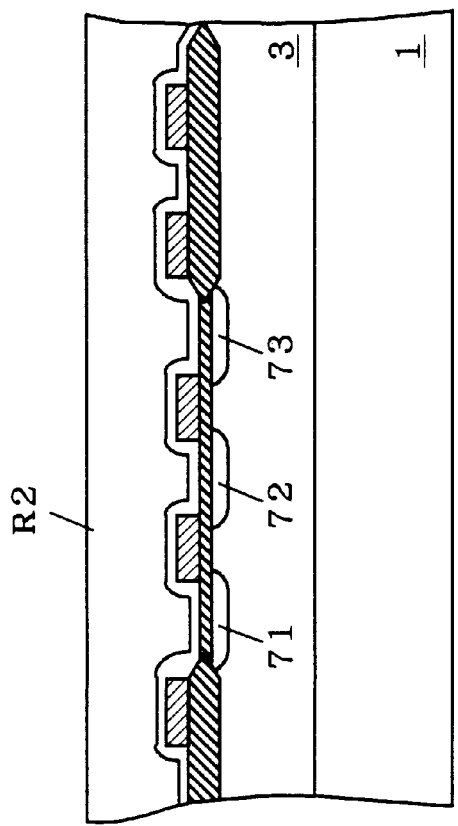
Figures 41A, 41B:
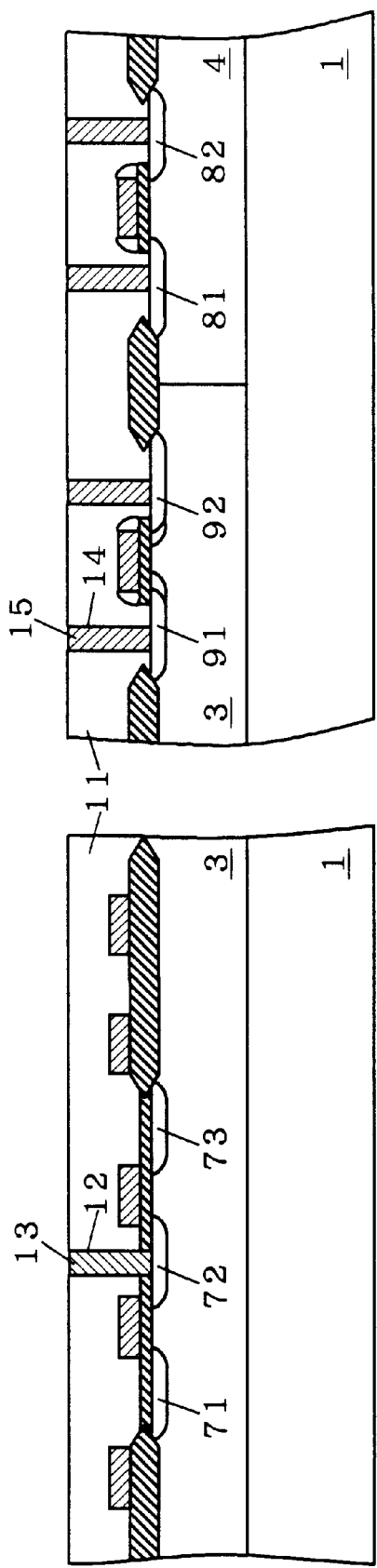
Figure 42A:
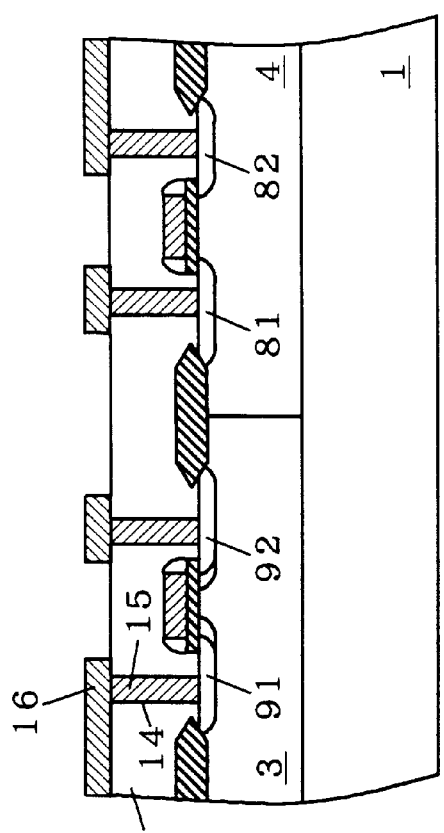
Figure 42B:
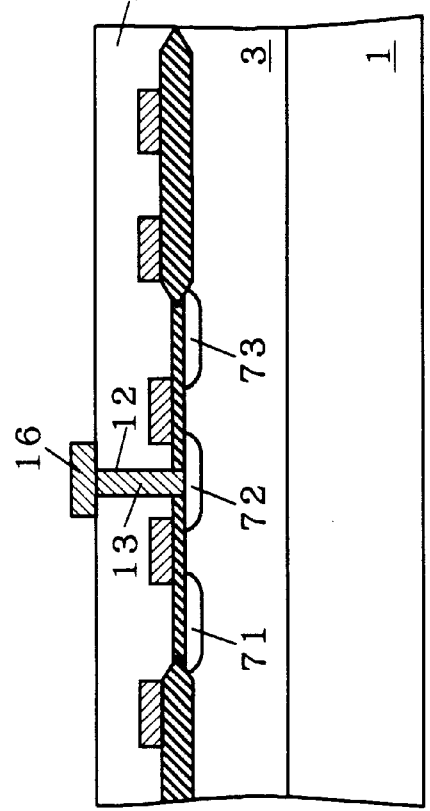
Figure 43A:
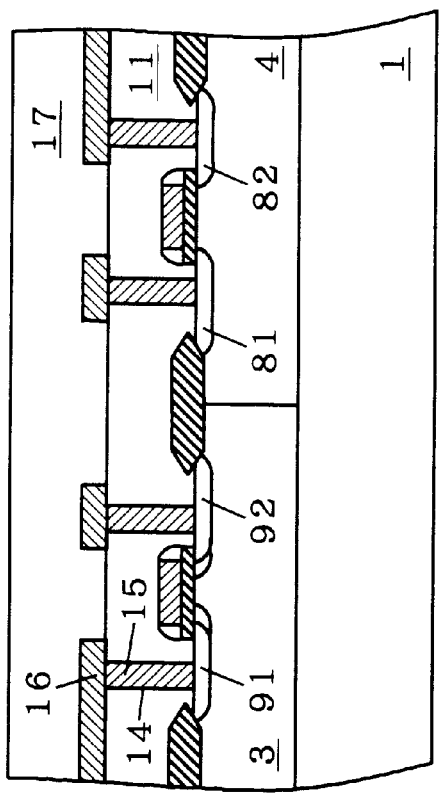
Figure 43B:
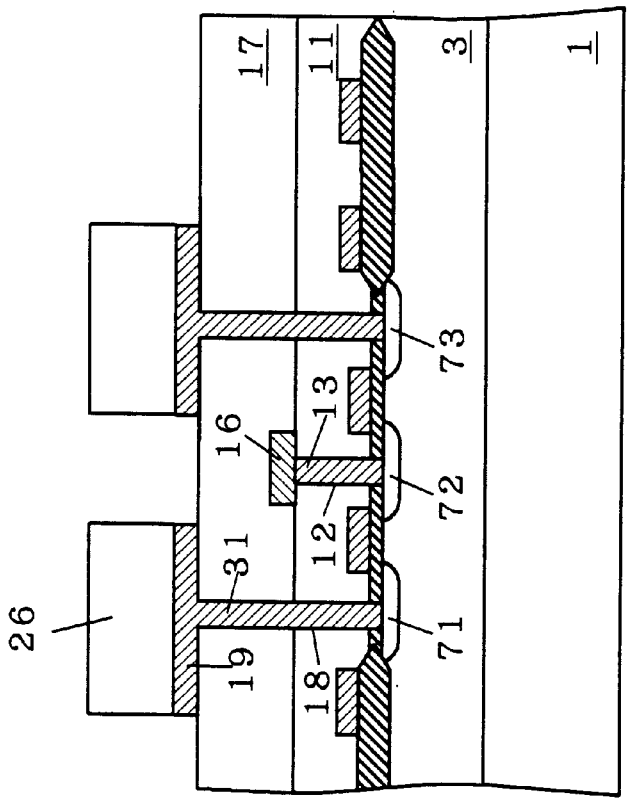
Figure 44B:
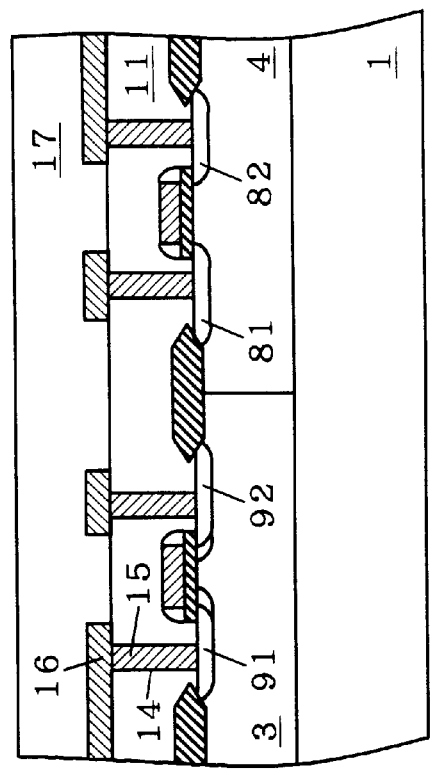
Figure 44A:
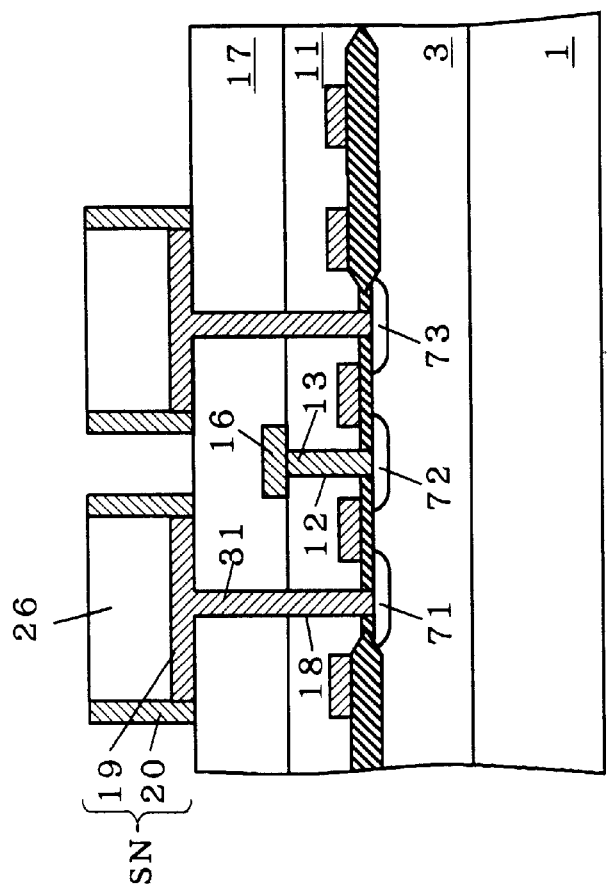
Figure 45B:
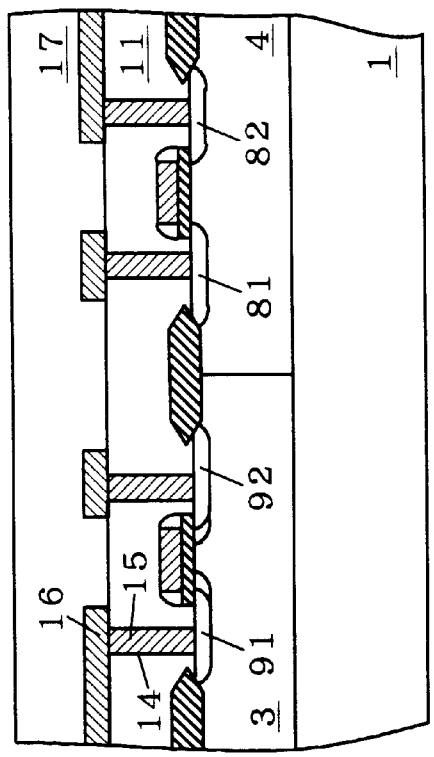
Figure 45A:
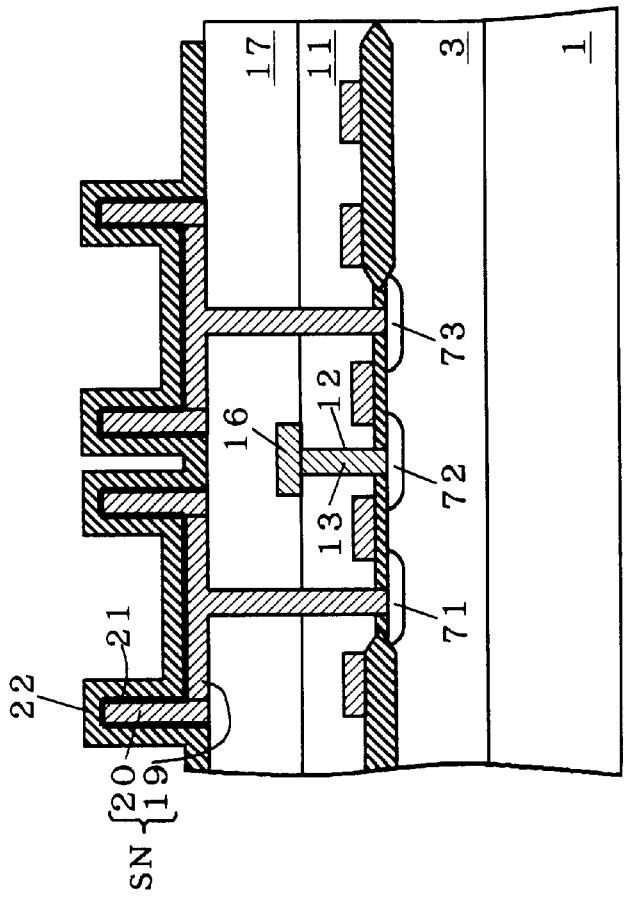
Figure 46A:
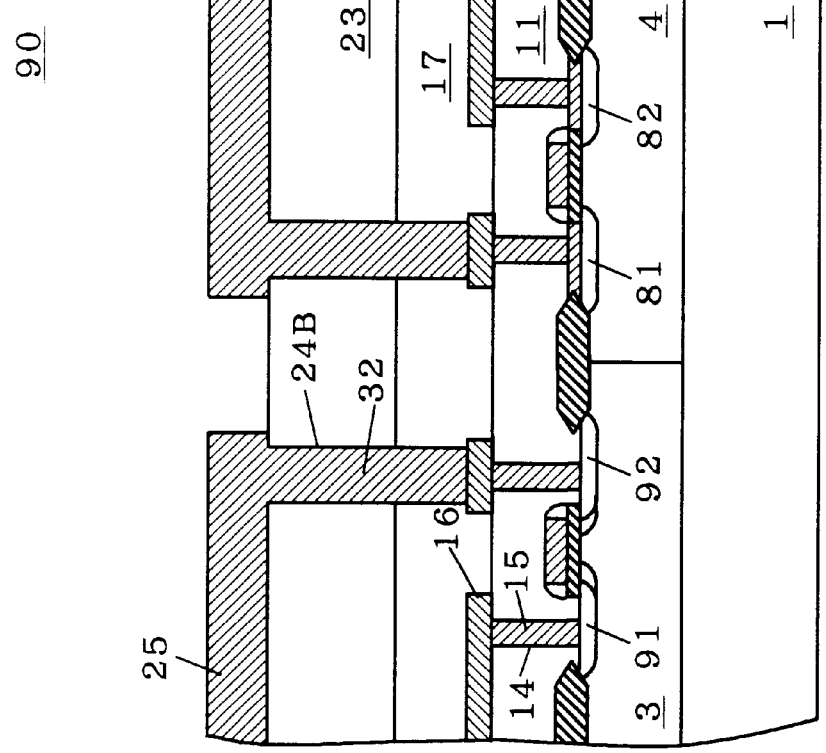
Figure 46B:
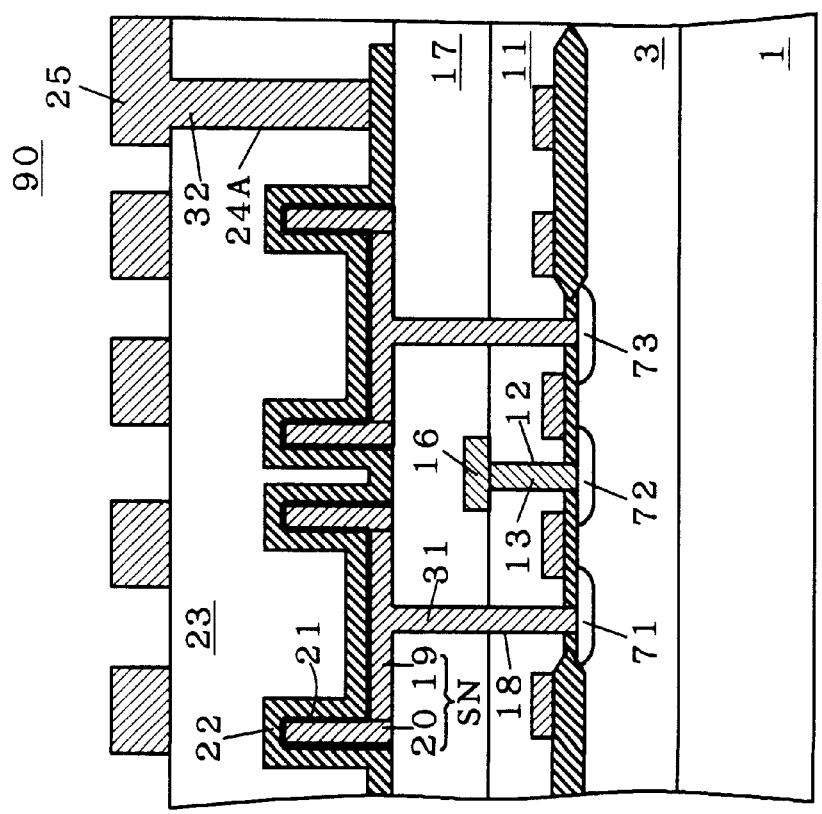

Next, referring to FIGS. 35 and 36, the structure for connecting the aluminum wiring to an enlarged contact part will be described. FIG. 35 is a schematic diagram showing an enlarged contact part CH10 formed between two parallel bit lines BL1 and BL2 and an aluminum wiring contact hole CH2 connected to the contact part CH10. A polysilicon plug PG1 is buried in the enlarged contact part CH10. FIG. 36 is a diagram showing the sectional structure taken along the line AA in FIG. 35, which shows the structure in which the contact hole CH1 and the enlarged contact part CH10 are formed in the interlayer insulating film IZ and the bit lines BL1 and BL2 are formed on the interlayer insulating film IZ1 formed to cover the enlarged contact part CH10 and the interlayer insulating film IZ. The aluminum wiring contact hole CH2 is formed through the interlayer insulating film IZ1 formed on the interlayer insulating film IZ.

As shown in FIGS. 35 and 36, when the diameter of the aluminum wiring contact hole CH2 is taken as Dc, the diameter of the enlarged contact part CH10 is taken as 2 ΔLa+Dc, and the alignment accuracy for directly connecting the aluminum wiring contact hole CH2 on the enlarged contact part CH10 is taken as ΔLa, then the alignment accuracy for preventing the aluminum wiring contact hole CH2 from protruding out of the interval between the bit lines BL1 and BL2 is given as $\sqrt{2}$ΔLa. This is because connecting the aluminum wiring contact hole CH2 and the enlarged contact part CH10 includes two positioning processes.

That is to say, the bit lines BL1 and BL2 are positioned with respect to the enlarged contact part CH10 and the aluminum wiring contact hole CH2 is positioned with respect to the enlarged contact part CH10, and hence misalignment must be considered in the individual steps. It is $\sqrt{3}$ΔLa when three positioning processes are included.

When the finishing accuracy of the bit line width and the aluminum wiring contact hole diameter is taken as ΔLcd, then the minimum interval between the bit lines BL1 and BL2 is given as Dc+2($\sqrt{2}$ΔLa+ΔLcd).

When the bit line interval based on minimum design rules is 0.16 μm, then Dc is 0.2 μm, ΔLa is 0.05 μm, ΔLcd is 0.03 μm, and the minimum interval between the bit lines BL1 and BL2 is 0.40 μm. Thus the interval between the bit lines BL1 and BL2 can be reduced by about 40% as compared with the case where the aluminum wiring is connected to the bit line pad.

The interval between the bit lines BL1 and BL2 can thus be shortened because they will not come into contact with the enlarged contact part CH10 even if the interval between the bit lines BL1 and BL2 is reduced, since the enlarged contact part CH10, which has the same function as the bit line pad, is formed below the bit lines BL1 and BL2 with the interlayer insulating film IZ1 therebetween.

Accordingly, it is possible to shorten the interval between the bit lines BL1 and BL2 until the mutually facing sides of the bit lines BL1 and BL2 are located above the edge of the enlarged contact part CH10.

The above-described layout in which aluminum wiring and silicon substrate are electrically connected through a contact hole formed between bit lines mostly appears in a sense amp zone in DRAM, for example. Accordingly, if the bit line interval cannot be reduced, the area of the sense amp zone cannot be reduced, and then the semiconductor device area cannot be reduced. The present invention enables reduction of the semiconductor device area.

<B-4. Characteristic Functions and Effects>

According to the second preferred embodiment of the present invention, as has been described referring to FIGS. 20A, 20B, 23A and 23B, the enlarged polysilicon plugs 53 and 57 are formed on the recessed polysilicon plugs 50 and 55 for connection to the aluminum wiring contact holes 24B. Accordingly, when the aluminum wiring contact holes are provided between bit lines, for example, the bit line interval can be reduced and the semiconductor device area can thus be reduced.

While the invention has been described in detail, the foregoing description is in all aspects illustrative and not restrictive. It is understood that numerous other modifications and variations can be devised without departing from the scope of the invention.

I claim:

1. A semiconductor device comprising:
   a first contact hole formed through a first part of an interlayer insulating film formed on a silicon substrate, to reach a first semiconductor layer of a first conductivity type in a surface of said silicon substrate;

a first buried layer buried in said first contact hole so as to directly contact with said first semiconductor layer and composed of polysilicon containing an impurity of the first conductivity type;

a first multi-layer wiring layer formed On said first buried layer connected to said first semiconductor layer through said first buried layer, a second contact hole formed through a second part of said interlayer insulating film to reach a second semiconductor layer of a second conductivity type in the surface of said silicon substrate;

a second buried layer buried in said second contact hole so as to directly contact with said second semiconductor layer and composed of polysilicon containing an impurity of the second conductivity type; and a second multi-layer wiring layer formed on said second buried layer and electrically connected to said second semiconductor layer through said second buried layer;

wherein said first and second multi-layer wiring layers at least comprise a barrier metal layer formed on said interlayer insulating film and a polysilicon layer formed on said barrier metal layer and composed of polysilicon containing an impurity of the first conductivity type, and said first buried layer is directly connected to said polysilicon layer penetrating said barrier metal layer.

2. The semiconductor device according to claim 1, wherein said second buried layer comprises a silicide film at a contact surface with said barrier metal layer.

3. A semiconductor device comprising:

first, second, and third interlayer insulating films stacked in order on a silicon substrate, a first contact hole formed through a first part of said first interlayer insulating film to reach a first semiconductor layer of a first conductivity type in a surface of said silicon substrate;

a first recessed polysilicon plug having its one end electrically connected to said first semiconductor layer and its other end located in a recessed position in said first contact hole, and composed of polysilicon containing an impurity of the first conductivity type;

a first polysilicon plug composed of the same material as said first recessed polysilicon plug, and buried in said first contact hole in a part from a main surface of said first interlayer insulating film to the other end of said first recessed polysilicon plug;

a second contact hole formed through a second part of said first interlayer insulating film and said second interlayer insulating film thereon to reach a second semiconductor layer of a second conductivity type in the surface of said silicon substrate;

a second recessed polysilicon plug having its one end electrically connected to said second semiconductor layer and its other end located in a recessed position in said second contact hole, and composed of polysilicon containing an impurity of the second conductivity type; and a second polysilicon plug buried in said second contact hole in a part from a main surface of said second interlayer insulating film to the other end of said second recessed polysilicon plug, and composed of the same material as said second recessed polysilicon plug;

wherein said first and second contact holes respectively comprise first and second enlarged contact parts whose opening diameter in the parts in which said first and second polysilicon plugs are buried is larger than opening diameter of the parts in which said first and second recessed polysilicon plugs are buried, wherein said first and second enlarged contact parts are completely buried by said first and second polysilicon plugs, and a wiring layer is formed above said third interlayer insulating film.

4. The semiconductor device according to claim 3, wherein said semiconductor device is a peripheral circuit part which operates in relation to a data holding part for holding data by accumulating charge in a capacitor.

* * * * *

UNITED STATES PATENT AND TRADEMARK OFFICE
CERTIFICATE OF CORRECTION

PATENT NO. : 6,333,535 B1
DATED : December 25, 2001
INVENTOR(S) : Okumura

It is certified that error appears in the above-identified patent and that said Letters Patent is hereby corrected as shown below:

Title page,
Item [45], and the Notice information should read:
-- [45] Date of Patent: *Dec. 25, 2001 --
-- (*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days. --

Signed and Sealed this

Thirtieth Day of April, 2002

*Attest:*

*Attesting Officer*

JAMES E. ROGAN
*Director of the United States Patent and Trademark Office*